US011198951B2

(12) United States Patent
Gardes et al.

(10) Patent No.: US 11,198,951 B2
(45) Date of Patent: Dec. 14, 2021

(54) MELT-GROWTH OF SINGLE-CRYSTAL ALLOY SEMICONDUCTOR STRUCTURES AND SEMICONDUCTOR ASSEMBLIES INCORPORATING SUCH STRUCTURES

(71) Applicant: University of Southampton, Hampshire (GB)

(72) Inventors: Frederic Yannick Gardes, Hampshire (GB); Graham Trevor Reed, Hampshire (GB); Callum George Littlejohns, Hampshire (GB)

(73) Assignee: University of Southampton, Hampshire (GB)

( * ) Notice: Subject to any disclaimer, the term of this patent is extended or adjusted under 35 U.S.C. 154(b) by 0 days.

(21) Appl. No.: 15/316,555

(22) PCT Filed: Jun. 5, 2015

(86) PCT No.: PCT/EP2015/062623
§ 371 (c)(1),
(2) Date: Dec. 6, 2016

(87) PCT Pub. No.: WO2015/185750
PCT Pub. Date: Dec. 10, 2015

(65) Prior Publication Data
US 2017/0175294 A1 Jun. 22, 2017

(30) Foreign Application Priority Data
Jun. 6, 2014 (GB) ........................................ 1410106
May 7, 2015 (GB) ........................................ 1507821

(51) Int. Cl.
*C30B 29/52* (2006.01)
*H01L 21/02* (2006.01)
(Continued)

(52) U.S. Cl.
CPC ............ *C30B 29/52* (2013.01); *C30B 11/002* (2013.01); *C30B 13/14* (2013.01); *C30B 13/22* (2013.01);
(Continued)

(58) Field of Classification Search
CPC ......... H01L 21/02546; H01L 21/02381; H01L 21/02293; H01L 21/02634; C30B 29/52
See application file for complete search history.

(56) References Cited

U.S. PATENT DOCUMENTS

| 6,169,007 B1 | 1/2001 | Pinter |
| 2005/0151223 A1 | 7/2005 | Voldman |

(Continued)

FOREIGN PATENT DOCUMENTS

WO WO 2005/117125 12/2005

OTHER PUBLICATIONS

Bai et al, Si incorporation from the seed into Ge stripes crystallized using rapid melt growth, Applied Physics Letters 104, 052104 (2014).
(Continued)

*Primary Examiner* — Changhyun Yi
(74) *Attorney, Agent, or Firm* — Renner, Otto, Boisselle & Sklar, LLP

(57) ABSTRACT

A method of fabricating at least one single-crystal alloy semiconductor structure. At least one seed, containing an alloying material, on a substrate for growth of at least one single-crystal alloy semiconductor structure is formed. At least one structural form, formed of a host material, on the substrate is crystallized to form the at least one single-crystal alloy semiconductor structure. The at least one structural form is heated such that the material of the at least one structural form has a liquid state. Also, the at least one structural form is cooled, such that the material of the at least
(Continued)

one structural form nucleates at the least one seed and crystallizes as a single crystal to provide at least one single-crystal alloy semiconductor structure, with a growth front of the single crystal propagating in a main body of the respective structural form away from the respective seed.

14 Claims, 16 Drawing Sheets

(51) Int. Cl.
    *C30B 11/00*     (2006.01)
    *C30B 13/14*     (2006.01)
    *C30B 13/22*     (2006.01)
    *C30B 13/34*     (2006.01)
    *C30B 29/06*     (2006.01)
    *C30B 29/08*     (2006.01)
    *C30B 29/18*     (2006.01)

(52) U.S. Cl.
    CPC .............. *C30B 13/34* (2013.01); *C30B 29/06* (2013.01); *C30B 29/08* (2013.01); *C30B 29/18* (2013.01); *H01L 21/0245* (2013.01); *H01L 21/02381* (2013.01); *H01L 21/02488* (2013.01); *H01L 21/02532* (2013.01); *H01L 21/02546* (2013.01); *H01L 21/02587* (2013.01); *H01L 21/02647* (2013.01); *H01L 21/02667* (2013.01); *H01L 21/02625* (2013.01); *H01L 21/02675* (2013.01)

(56) References Cited

U.S. PATENT DOCUMENTS

| | | | |
|---|---|---|---|
| 2005/0230683 | A1 | 10/2005 | Yamaguchi et al. |
| 2007/0023811 | A1 | 2/2007 | Voegeli et al. |
| 2009/0236587 | A1* | 9/2009 | Miyao ................. H01L 27/0617 257/19 |
| 2010/0252814 | A1 | 10/2010 | Sekaric et al. |
| 2012/0282718 | A1* | 11/2012 | Lochtefeld .............. H01L 33/06 438/47 |
| 2015/0318355 | A1* | 11/2015 | Wang ................ H01L 21/02639 438/479 |

OTHER PUBLICATIONS

Bakkers et al, Epitaxial growth of InP nanowires on germanium, Nature Materials 3, 769-773 (2004).
Balakumar et al, Fabrication Aspects of Germanium on Insulator from Sputtered Ge on Si-Substrates, Electrochemical and Solid-State Letters 9, 5, G158-G160 (2006).
Chaisakul et al, 10-Gb/s Ge/SiGe Multiple Quantum-Well Waveguide Photodetector, Photonics Technology Letters, IEEE 23, 20, 1430-1432 (2011).
Chen et al, Single-Crystal GaAs and GaSb on Insulator on Bulk Si Substrates Based on Rapid Melt Growth, Electron Device Letters, IEEE 31, 6, 597-599 (2010).
Feng D et al, High speed GeSi electro-absorption modulator at 1550 nm wavelength on SOI waveguide, Optics Express 20, 20, 22224-22232 (2012).
Feng J et al, Integration of Germanium-on-Insulator and Silicon MOSFETs on a Silicon Substrate, Electron Device Letters, IEEE 27, 11, 911-913 (2006).
Feng J et al, P-Channel Germanium FinFET Based on Rapid Melt Growth, Electron Device Letters, IEEE 28, 7, 637-639 (2007).
Feng J et al, High-Performance Gate-All-Around GeOI p-MOSFETs Fabricated by Rapid Melt Growth Using Plasma Nitridation and ALD $Al_2O_3$ Gate Dielectric and Self-Aligned NiGe Contacts, Electron Device Letters, IEEE 29, 7, 805-807 (2008).
Feng J, High-Performance Germanium-On-Insulator MOSFETs for Three-Dimensional Integrated Circuits Based on Rapid Melt Growth, Mar. 2009, ProQuest LLC.
Going et al, Germanium Gate PhotoMOSFET Integrated to Silicon Photonics, Journal of Selected Topics in Quantum Electronics, IEEE 20, 4, 1-7 (2014).
Huang et al, Very Low Defects and High Performance Ge-On-Insulator p-MOSFETs with $Al_2O_3$ Gate Dielectrics, 2003 Symposium on VLSI Technology Digest of Technical Papers, 119-120 (2003).
Jutzi et al, Ge-on-Si Vertical Incidence Photodiodes with 39-GHz Bandwidth, Photonics Technology Letters, IEEE 17, 7, 1510-1512 (2005).
Koh, Rapid melt growth of silicon germanium for heterogeneous integration on silicon, PhD thesis, Stanford University (2011).
Lever et al, Modulation of the absorption coefficient at 1.3 µm in Ge/SiGe multiple quantum well heterostructures on silicon, Optics Letters 36, 21, 4158-4160 (2011).
Littlejohns et al, "Silicon-germanium composition engineering for next generation multilayer devices and systems", IEEE 11th International Conference on Group IV Photonics, 1-2 (2014).
Liu H et al, Long-wavelength InAs/GaAs quantum-dot laser diode monolithically grown on Ge substrate, Nature Photonics 5, 416-419 (2011).
Liu J et al, Waveguide-integrated, ultralow-energy GeSi electro-absorption modulators, Nature Photonics 2, 433-437 (2008).
Luo et al, Strong Electro-Absorption in GeSi Epitaxy on Silicon-on-Insulator (SOI), Micromachines 3, 345-363 (2012).
Matsumura et al, Growth-rate-dependent laterally graded SiGe profiles on insulator by cooling-rate controlled rapid-melting-growth, Applied Physics Letters 101, 241904(1-5) (2012).
Miyao et al, Giant Ge-on-Insulator Formation by Si—Ge Mixing-Triggered Liquid-Phase Epitaxy, Applied Physics Express 2, 045503(1-3) (2009).
Miyao et al, High-quality single-crystal Ge stripes on quartz substrate by rapid-melting-growth, Applied Physics Letters 95, 022115(1-3) (2009).
Mooney et al, Raman scattering analysis of relaxed $Ge_xSi_{1-x}$ alloy layers, Applied Physics Letters 62, 2069-2071 (1993).
Nakaharai et al, Characterization of 7-nm-thick strained Ge-on-insulator layer fabricated by Ge-condensation technique, Applied Physics Letters 83, 17, 3516-3518 (2003).
Nelson, Epitaxial Growth From the Liquid State and Its Application to the Fabrication of Tunnel and Laser Diodes, RCA Rev. 24, 603-615 (1963).
Ohta et al, Growth-direction-dependent characteristics of Ge-on-insulator by Si—Ge mixing triggered melting growth, Solid-State Electronics 60, 18-21 (2011).
Panish et al, Double-Heterostructure Injection Lasers With Room-Temperature Thresholds as Low as 2300 $A/cm^2$, Applied Physics Letters 16, 6, 326-327 (1970).
Pitera et al, Coplanar Integration of Lattice-Mismatched Semiconductors with Silicon by Wafer Bonding $Ge/Si_{1-x}Ge_x$ /Si Virtual Substrates, Journal of The Electrochemical Society 151, 7, G443-G447 (2004).
Sakane et al, Strained single-crystal GOI (Ge on Insulator) arrays by rapid-melting growth from Si (1 1 1) micro-seeds, Solid-State Electronics 60, 22-25 (2011).
Saul et al, Vapor-Doped Multislice LPE for Efficient GaP Green LED's, Journal of The Electrochemical Society 120, 8, 1128-1131 (1974).
Schaevitz et al, Material Properties of Si—Ge/Ge Quantum Wells, Journal of Selected Topics in Quantum Electronics, IEEE 14, 4, 1082-1089 (2008).
Schaevitz et al, Material Properties of Si—Ge/Ge Quantum Wells for Silicon Integrated Electro-Absorption Devices, Lasers and Electro-Optics 2008 and Conference on Quantum Electronics and Laser Science 2008, CLEO/QELS (2008).
Taraschi et al, Strained Si, SiGe, and Ge on-insulator: review of wafer bonding fabrication techniques, Solid-State Electronics 48, 1297-1305 (2004).

(56) References Cited

OTHER PUBLICATIONS

Tojo et al, High-quality formation of multiply stacked SiGe-on-insulator structures by temperature-modulated successive rapid-melting-growth, Applied Physics Letters 102, 092102(1-4_ (2013).
Tseng et al, A self-assembled microbonded germanium/silicon heterojunction photodiode for 25 Gb/s high-speed optical interconnects, Scientific Reports 3:3225(1-6) (2013).
Tweet et al, Characterization and reduction of twist in Ge on insulator produced by localized liquid phase epitaxy, Applied Physics Letters 87, 141908(1-3) (2005).
Vivien et al, 42 GHz p.i.n Germanium photodetector integrated in a silicon-on-insulator waveguide, Optics Express 17, 8, 6252-6257 (2009).
Watanabe et al, "Fabrication of High-quality GOI and SGOI Structures by Rapid Melt Growth Method—Novel Platform for High-mobility Transistors and Photonic Devices—", ECS Transactions, 50(4), 261-266 (2012).
Wieder et al, $In_xGa_{1-x}As_yP_{1-y}$/InP heterojunction photodiodes, Applied Physics Letters 31, 7, 468-470 (1977).

\* cited by examiner

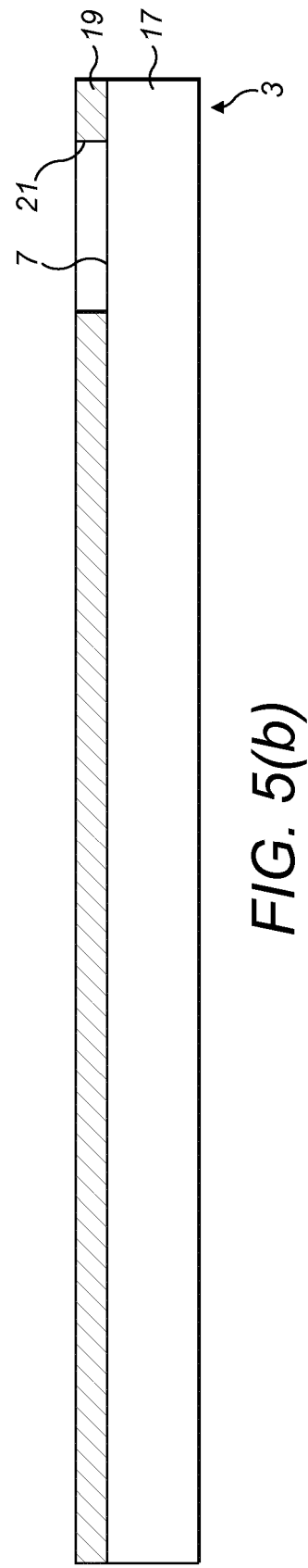

MELT-GROWTH OF SINGLE-CRYSTAL ALLOY SEMICONDUCTOR STRUCTURES AND SEMICONDUCTOR ASSEMBLIES INCORPORATING SUCH STRUCTURES

This application is a national phase of International Application No. PCT/EP2015/062623 filed Jun. 5, 2015 and published in the English language, which claims priority to United Kingdom Patent Application Nos. 1507821.5 filed May 7, 2015 and 1410106.7 filed Jun. 6, 2014, which are all hereby incorporated herein by reference in their entirety.

The present invention relates to the melt-growth of single-crystal alloy semiconductor structures, especially to structures fabricated on an insulator, and semiconductor assemblies incorporating such structures.

The present invention typically has application in electronic, photovoltaic and photonic devices, such as wavelength-sensitive devices[1,2], photodetectors, mid-infrared waveguides and high-mobility complementary metal oxide semiconductor (CMOS) devices and circuits, and also, for example, in the fabrication of QCSE optical modulators and detectors and Franz Keldysh optical modulators. The present invention also has application in, and lattice matching for, epitaxial III-V growth[3,4].

One such alloy semiconductor is SiGe, which has application, for example, in a SiGe-on-insulator (SGOI) device or circuit. Other alloy semiconductors include GeSi, GaAs and GaSb[5].

Methods exist for producing SGOI films on Si wafers, including layer transfer[6-8] and Ge condensation[8,9].

A rapid melt-growth technique (RMG), also referred to as liquid phase epitaxy (LPE), has also been developed for fabricating localized SGOI regions on a Si wafer. RMG was originally used for III-V crystal growth, being first utilized for localized germanium-on-insulator (GOI) growth[14-20] and having more recently been adapted for SGOI growth[21-23].

RMG is attractive for the heterogeneous integration of SiGe-based devices on insulator for electronics, photovoltaics and photonics because it is possible to grow defect-free single-crystal material. This can lead to significant improvements in device characteristics, such as high mobility, low leakage current and high quantum efficiency.

However, the existing process of RMG for the fabrication of SiGe strips leads to a gradation of the Si concentration along the strip, typically from a relatively-low Ge concentration in a seed area at one end of the strip, which correlates to the annealing temperature, to 100% Ge at the other, distal end of the strip. This compositional variation typically renders these structures unsuitable for SiGe devices, and it is desirable to be able to control the Si concentration.

It is an aim of the present invention to provide a method for the melt-growth of single-crystal alloy semiconductor structures, especially where fabricated on an insulator, which exhibits improved control in composition and hence uniformity in composition, through the growth area. Consequently, this will result in single-crystal alloy semiconductor structures having improved characteristics, as discussed above.

The present inventors have devised a method, using tailored designs, of controlling inter-diffusion at the growth front in a melt-growth process, which yields a more consistent composition concentration within the resulting structure.

In one aspect the present invention provides a method of fabricating at least one single-crystal alloy semiconductor structure, comprising: forming at least one seed on a substrate for growth of at least one single-crystal alloy semiconductor structure, the at least one seed containing an alloying material; providing at least one structural form on the substrate which is crystallized to form the at least one single-crystal alloy semiconductor structure, the at least one structural form being formed of a host material and comprising a main body which extends from the at least one seed and a plurality of elements which are connected in spaced relation to the main body; heating the at least one structural form such that the material of the at least one structural form has a liquid state; and cooling the at least one structural form, such that the material of the at least one structural form nucleates at the least one seed and crystallizes as a single crystal to provide at least one single-crystal alloy semiconductor structure, with a growth front of the single crystal propagating in the main body of the respective structural form away from the respective seed; wherein the plurality of elements of each structural form provide reservoirs of the alloying material in liquid state, such that successive ones of the plurality of elements act to maintain, in liquid state, an available supply of the alloying material to the growth front of the single crystal in the main body of the respective structural form.

In another aspect the present invention provides a semiconductor pre-form from which at least one single-crystal semiconductor structure is fabricated, the semiconductor pre-form comprising: a substrate; at least one seed on the substrate for growth of at least one single-crystal alloy semiconductor structure, the at least one seed containing an alloying material; at least one structural form on the substrate which, when crystallized, forms the at least one single-crystal alloy semiconductor structure, the at least one structural form being formed of a host material and comprising a main body which extends from the at least one seed and a plurality of elements which are connected in spaced relation to the main body; wherein the plurality of elements of each structural form provide reservoirs of the alloying material in liquid state when heated to a temperature above the melting point of the material of the at least one structural form, such that successive ones of the plurality of elements act to maintain during fabrication, in liquid state, an available supply of the alloying material to a growth front of a single crystal in the main body of the respective structural form.

In a further aspect the present invention provides a semiconductor assembly, comprising: a substrate; and at least one single-crystal semiconductor structure on the substrate, the at least one semiconductor structure being formed of an alloy of a host material and an alloying material and comprising a main body and a plurality of elements which extend in spaced relation to the main body.

In the present invention, during crystal growth, successive ones of reservoirs act to maintain, in liquid phase, an available supply of the alloying material, in one embodiment Si, to the growth front in the main body, in one embodiment GeSi, such as to prevent the complete consumption of the alloying material before complete crystallisation of the main body has occurred, and therefore maintain a given concentration of the alloying material within the fabricated alloy semiconductor. Moreover, the liquid phase at the reservoirs provides for a substantially greater rate of cooling, which provides that the segregation rate of the alloying material at the growth front is substantially reduced, thereby limiting the change in the alloying material concentration along the growth front.

The present invention provides a fabrication technology that enables the fabrication of electronic, photovoltaic and photonic devices on a common substrate, typically a wafer, such as a Si wafer or silica ($SiO_2$) wafer.

Furthermore, the present invention provides a single-crystal, defect-free material which has a generally-uniform composition.

Still furthermore, the present invention enables the fabrication of a plurality of structures requiring different alloy composition on the same substrate using a single deposition step and a single annealing step through control of the annealing temperature and the material design, enabling a composition to be dictated by structural design and not by the deposition or growth mechanism.

The present invention has particular application to the fabrication of SiGe. SiGe has a number of attractive characteristics. SiGe possesses full miscibility across its entire composition range which allows for bandgap tuning for wavelength-sensitive devices, and lattice matching, whereby the lattice constant can be perfectly matched to other materials, enabling it to act as a substrate for epitaxial growth of the lattice-matched material, e.g. GaAs. Depending on the composition, SiGe compounds can be either optically absorbing or transparent at telecommunication wavelengths (approximately 1550 nm or 1310 nm), thus enabling the fabrication of active devices for both optical modulation[29-32] and detection[33,34]. Also, SiGe has a higher hole and electron mobility as compared to Si, meaning that it will ultimately lead to faster devices, e.g. transistors, and is also fully compatible with current CMOS processes, and therefore avoids the contamination issues associated with III-V materials.

Preferred embodiments of the present invention will now be described hereinbelow by way of example only with reference to the accompanying drawings, in which.

Figure 1:
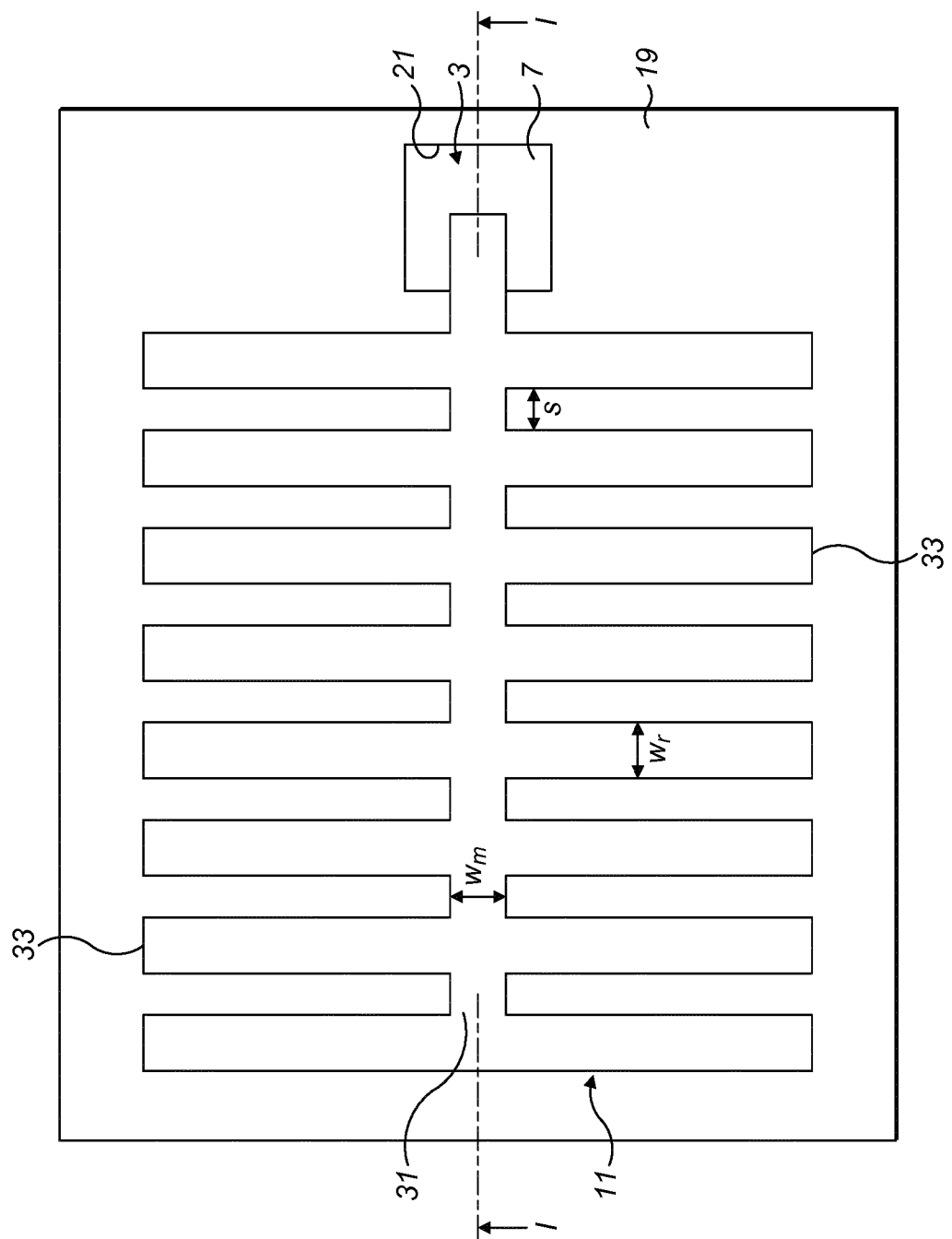
FIG. 1 illustrates a plan view of a semiconductor assembly in accordance with a first embodiment of the present invention, with the capping insulation removed for purposes of illustration.
Figure 2:
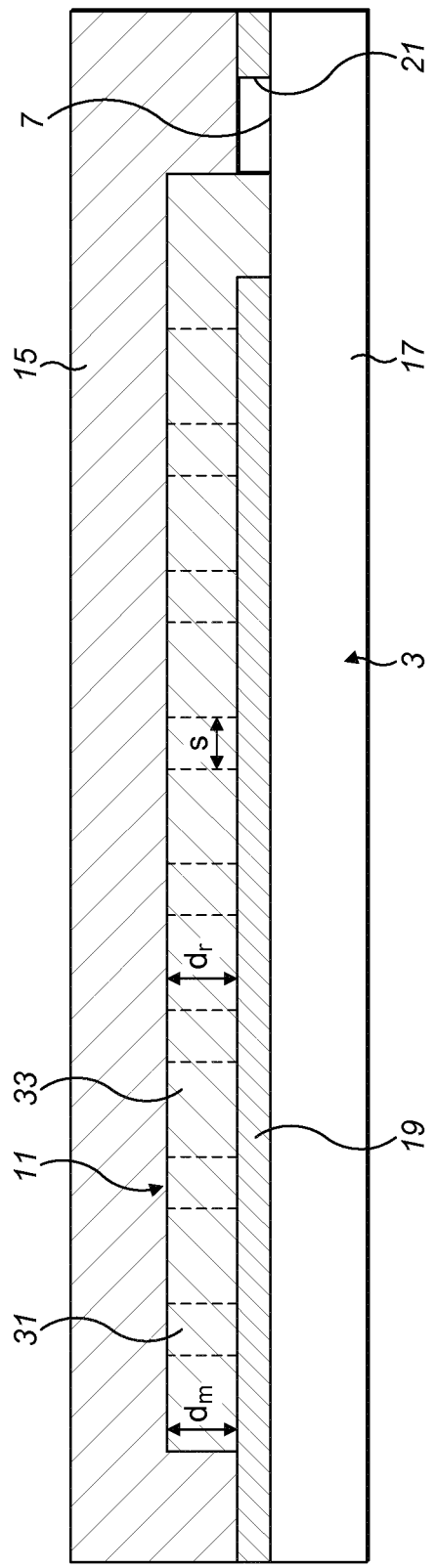
FIG. 2 illustrates a sectional view (along section I-I in FIG. 1) of the semiconductor assembly of FIG. 1.
Figure 6:
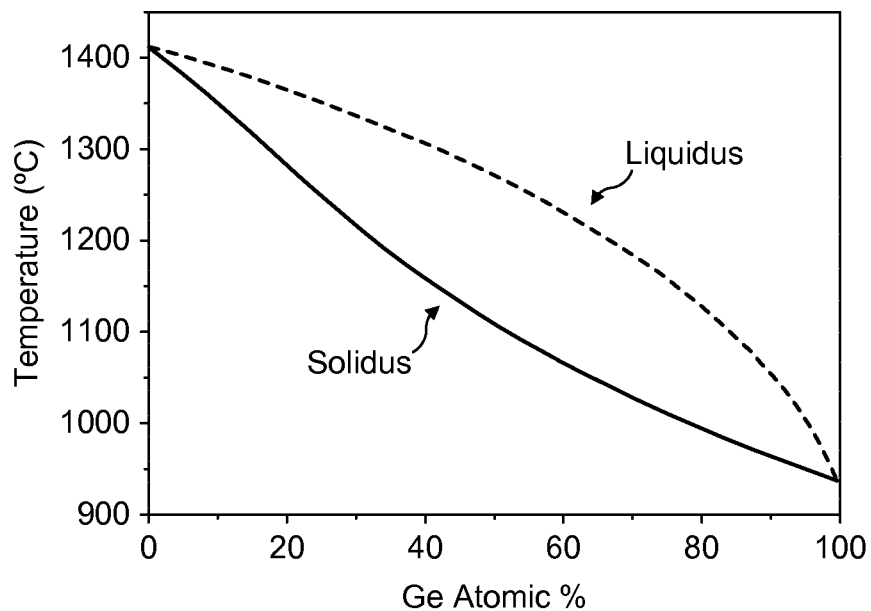
Figure 7:
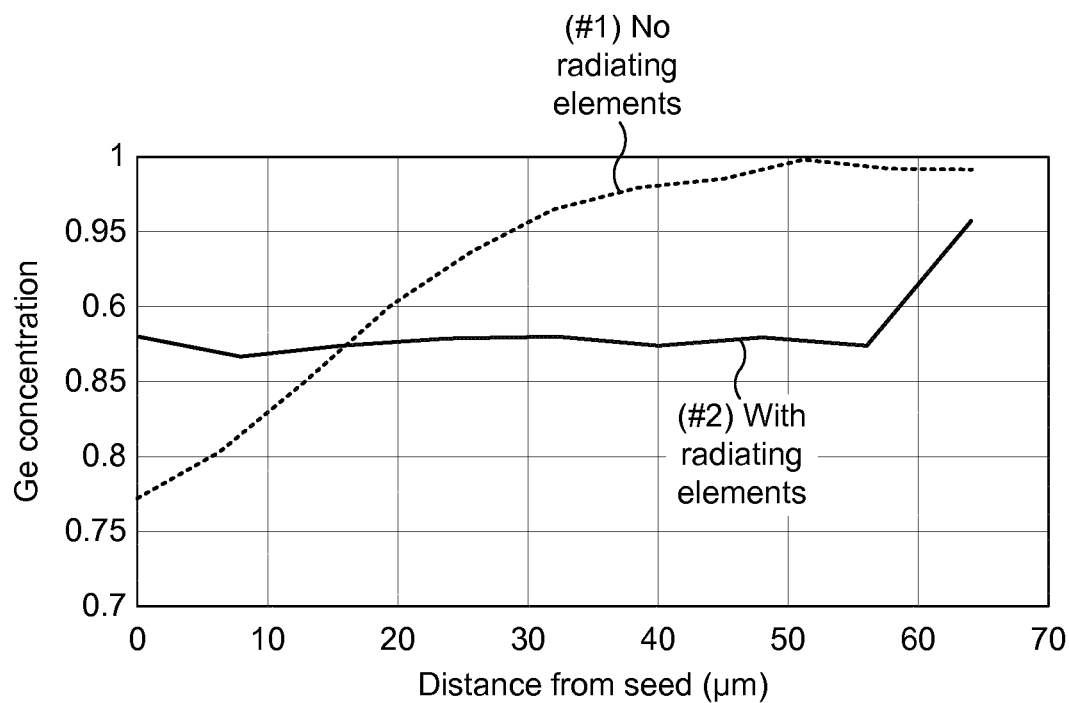
Figure 8:
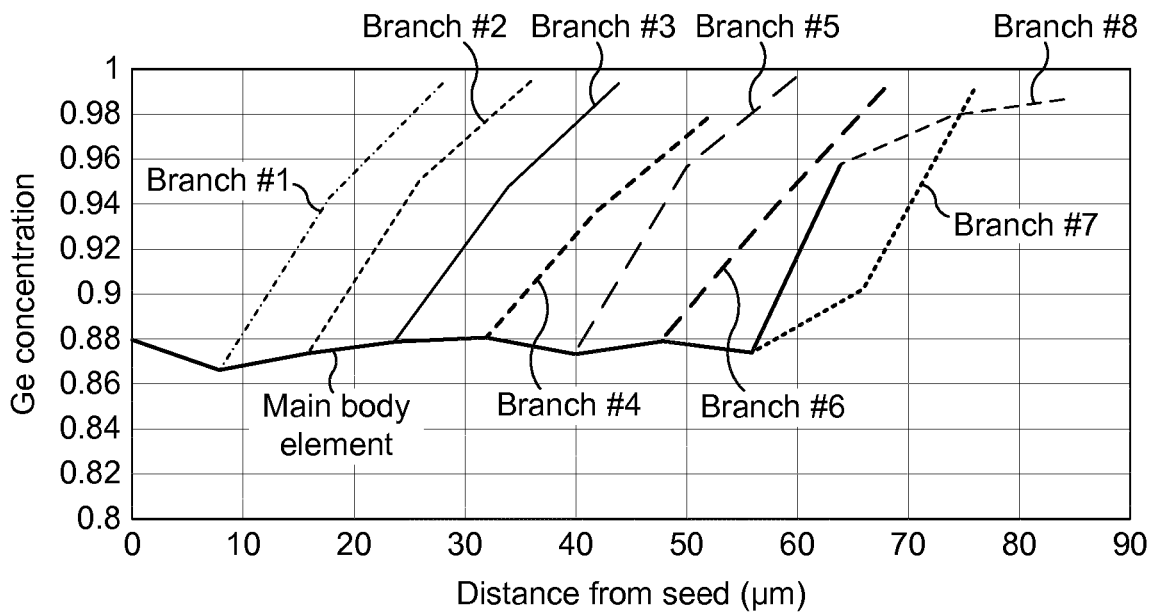
Figure 9:
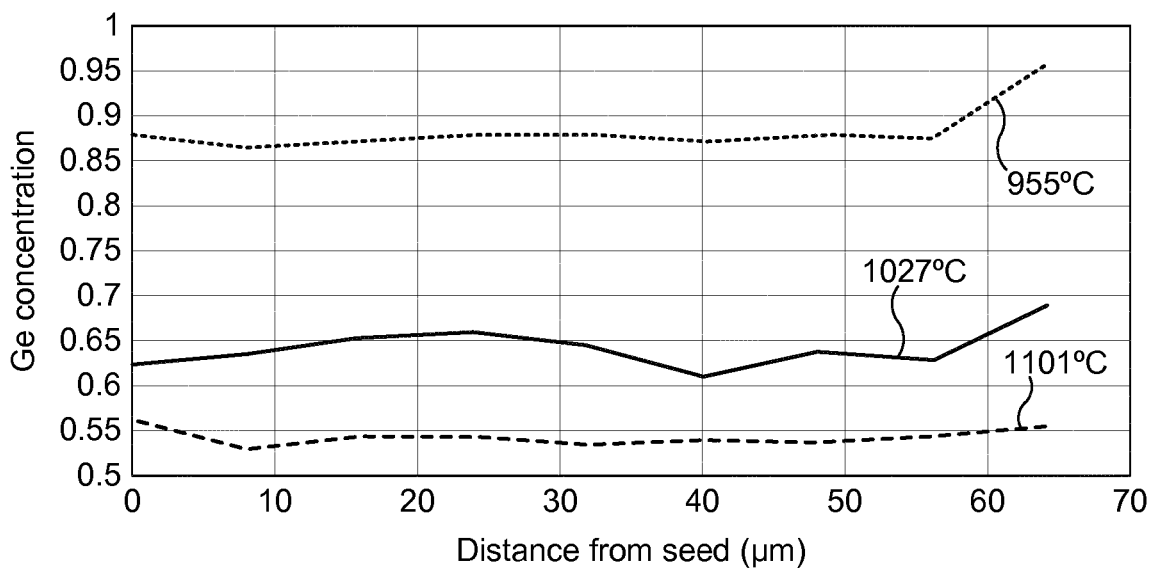
Figure 10:
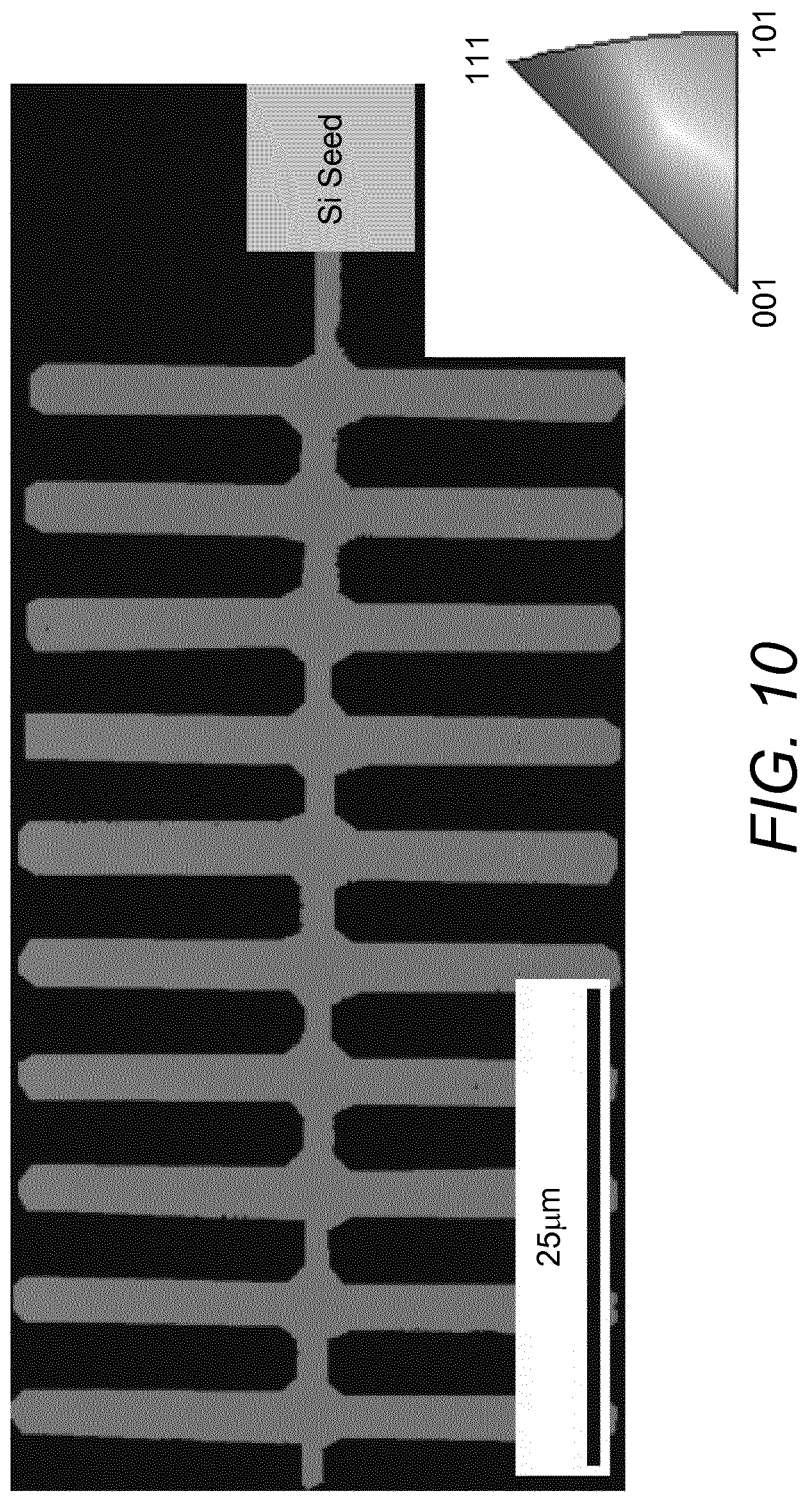
Figure 11:
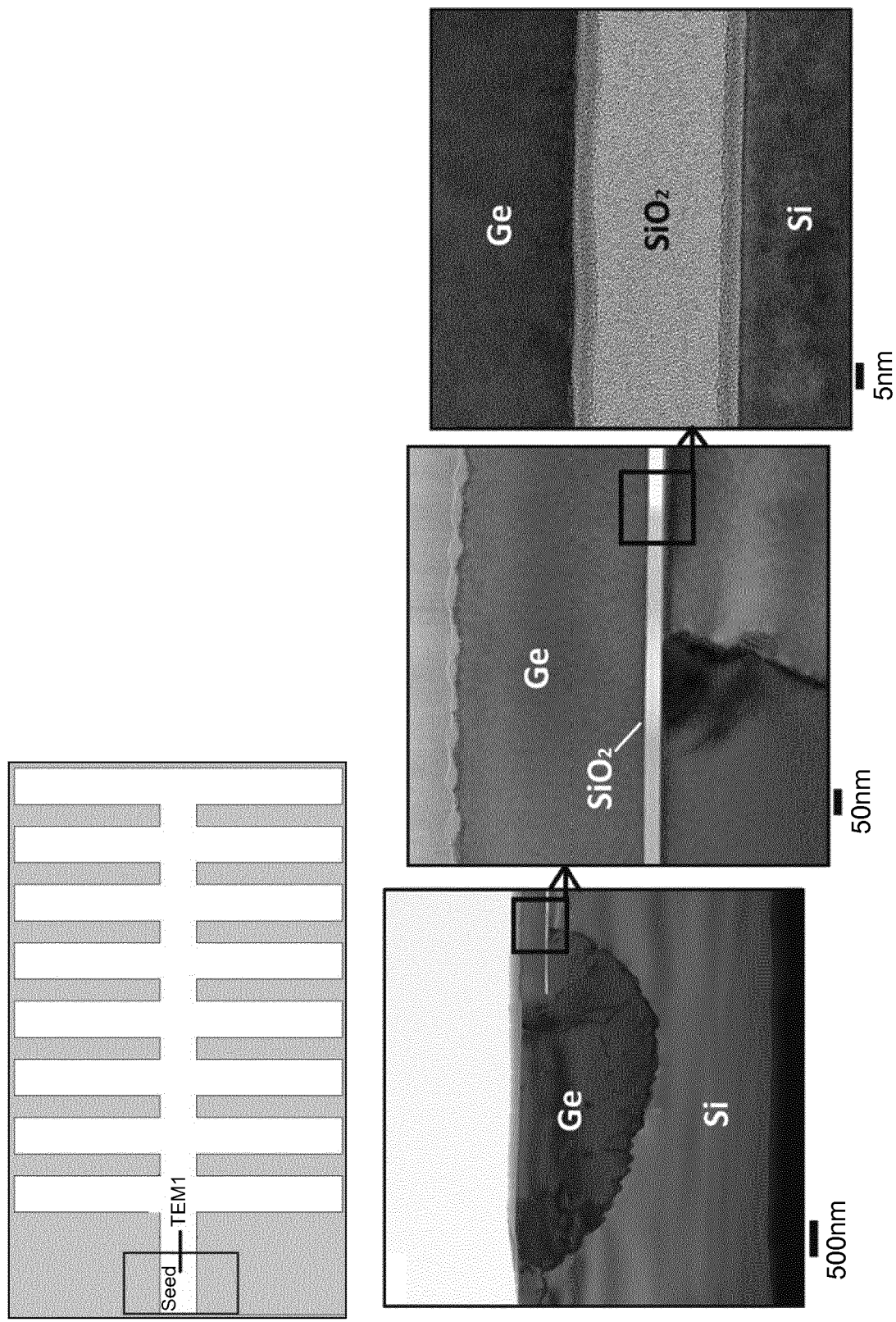
Figure 12:
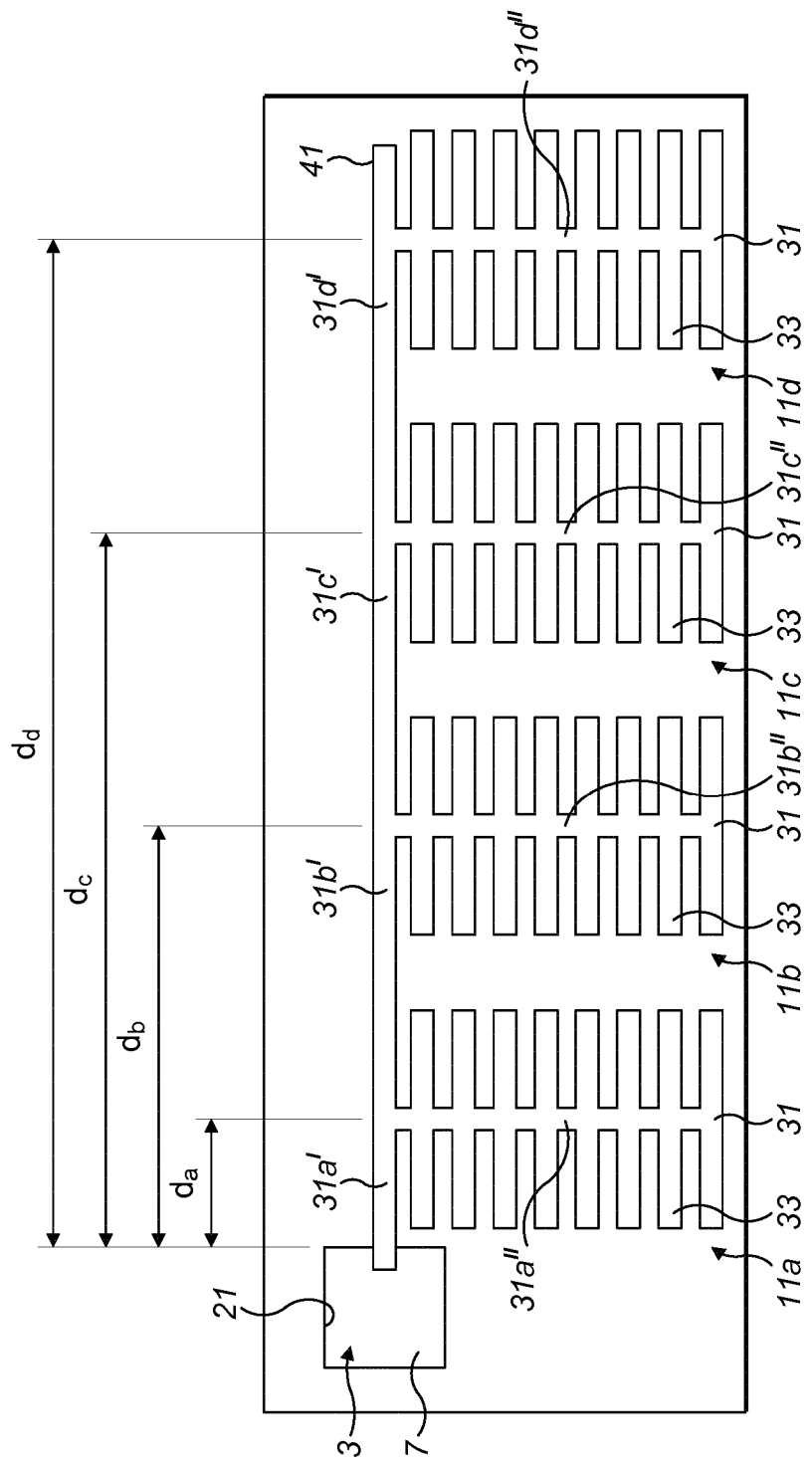
Figure 13:
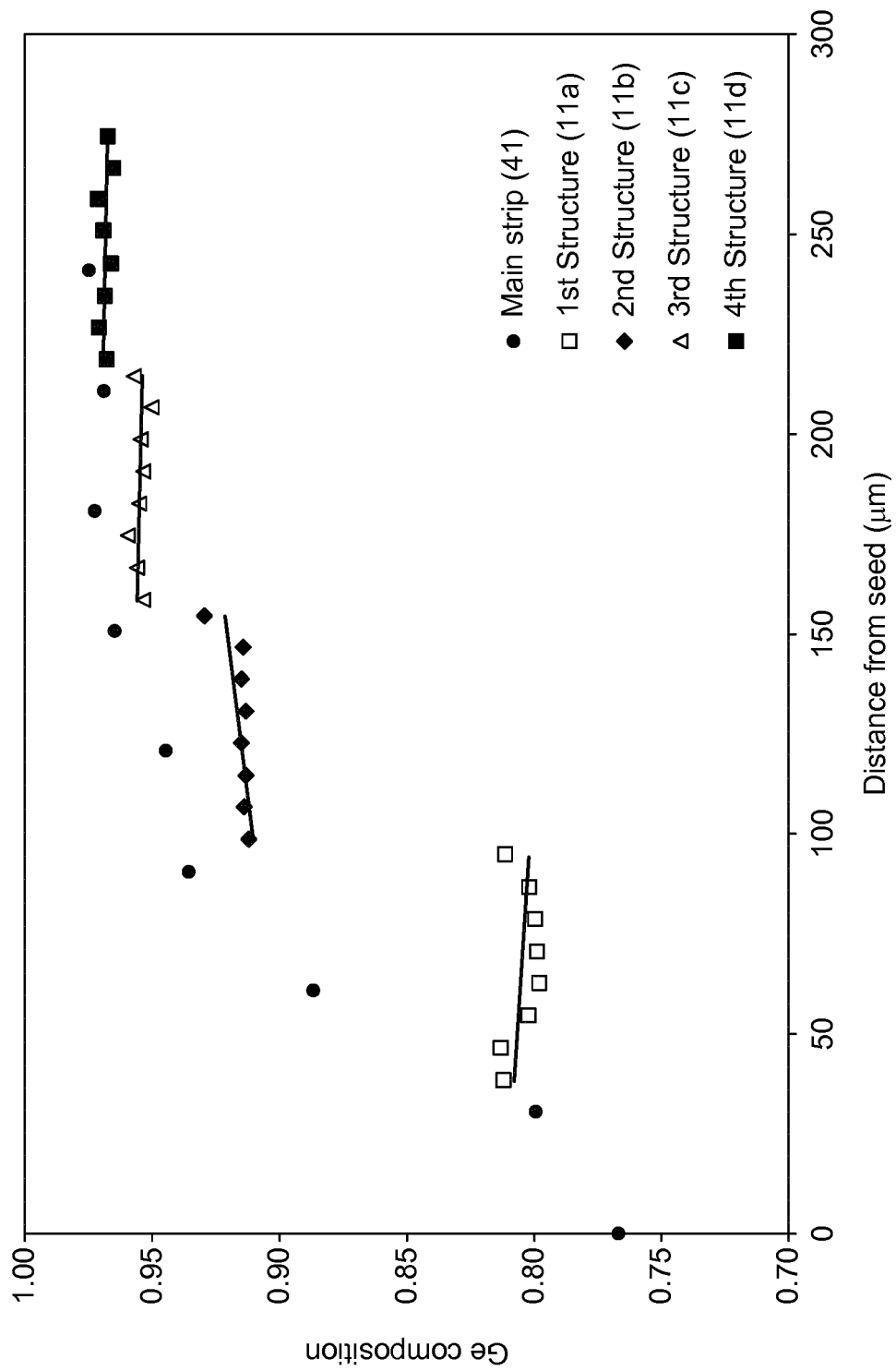
Figure 14:
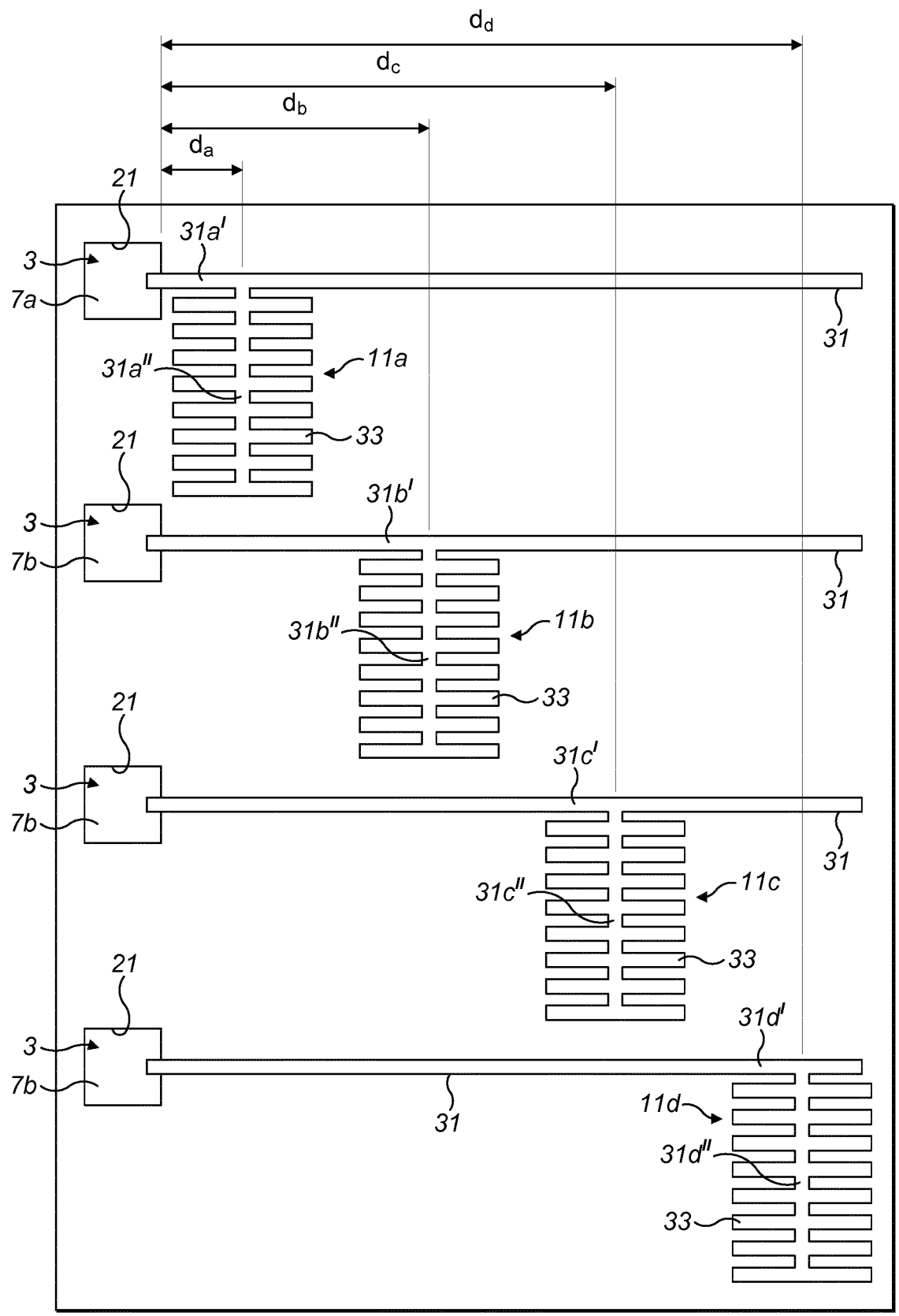
Figure 15:
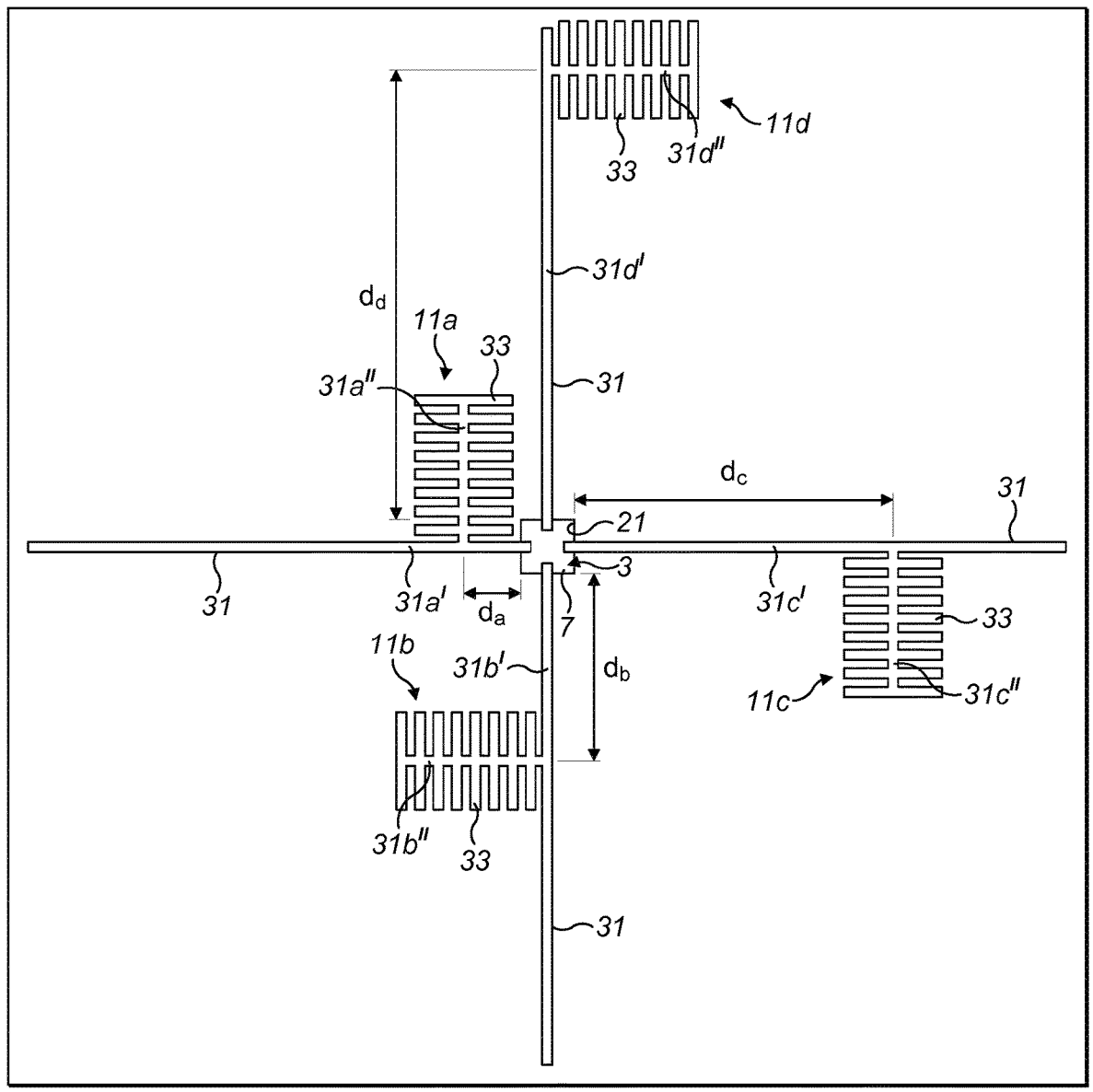
Figure 16:
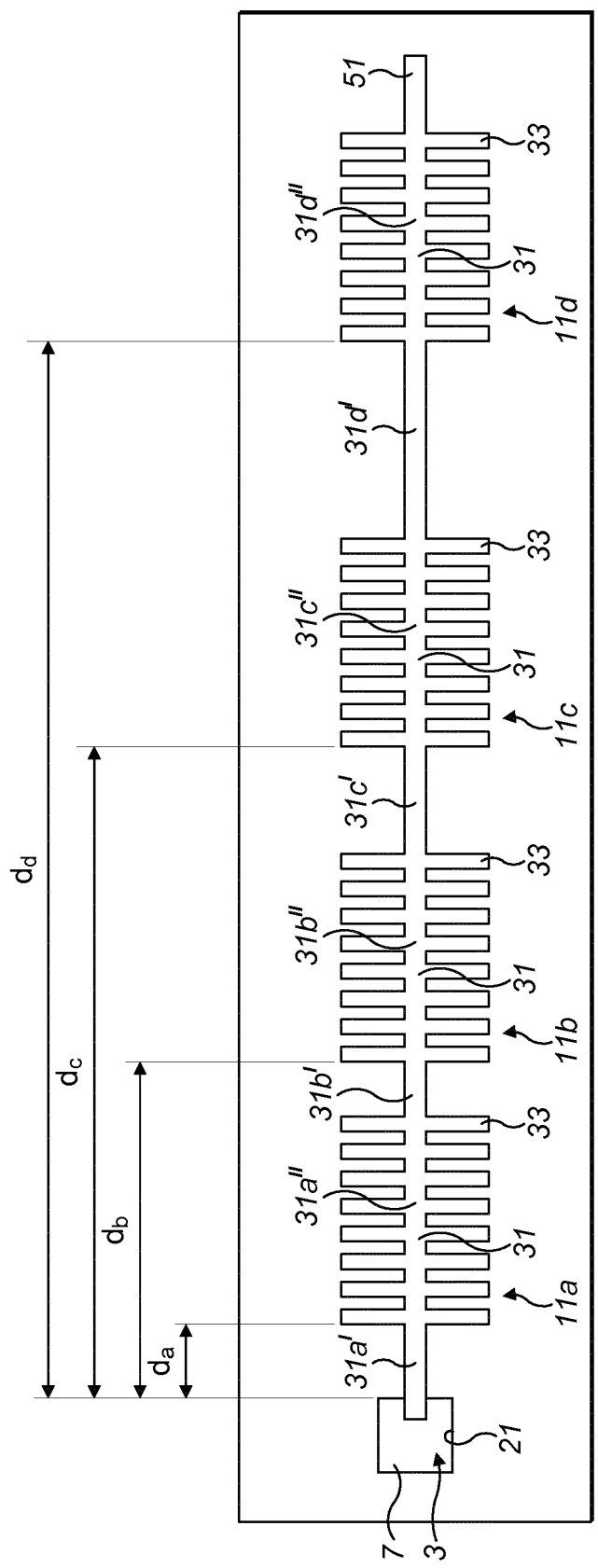

FIGS. 5(a) to (e) illustrate the operative steps in the fabrication of the semiconductor assembly of FIGS. 1 and 2;

FIG. 6 illustrates the phase diagram for the alloy GeSi;

FIG. 7 illustrates plots of the concentration of the host material as a function of distance from the seed for a semiconductor assembly (Sample #1) having a structure comprising only a main body and no radiating elements, and a semiconductor assembly (Sample #2) of FIGS. 1 and 2 having a structure comprising a main body and radiating elements, both annealed at a temperature of 955° C.;

FIG. 8 illustrates a plot of the concentration of the host material as a function of the distance from the seed for the main body and the branch or radiating elements (Branches #1-8, with Branch #1 being closest to the seed) of Sample #2;

FIG. 9 illustrates plots of the concentration of the host material as a function of distance from the seed for three semiconductor assemblies of FIGS. 1 and 2, annealed at temperatures of 955° C., 1027° C. and 1101° C., respectively FIG. 10 illustrates an electon back-scatter diffraction (EBSD) scan on a structure of a semiconductor assembly of FIGS. 1 and 2;

FIG. 11 illustrates transmission electron microscope (TEM) images of the interface between a seed at the surface of the substrate body and a structure of a semiconductor assembly of FIGS. 1 and 2;

FIG. 12 illustrates a plan view of a semiconductor assembly in accordance with a fourth embodiment of the present invention, with the capping insulation removed for purposes of illustration;

FIG. 13 illustrates plots of the concentration of the host material at spaced locations along a length of the second section of each of the main bodies of the semiconductor structures of FIG. 12;

FIG. 14 illustrates a plan view of a semiconductor assembly in accordance with a fifth embodiment of the present invention, with the capping insulation removed for purposes of illustration;

FIG. 15 illustrates a plan view of a semiconductor assembly in accordance with a sixth embodiment of the present invention, with the capping insulation removed for purposes of illustration; and FIG. 16 illustrates a plan view of a semiconductor assembly in accordance with a sixth embodiment of the present invention, with the capping insulation removed for purposes of illustration.

FIGS. 1 and 2 illustrate an alloy semiconductor assembly in accordance with a first embodiment of the present invention.

The semiconductor assembly comprises a substrate 3, at least one seed 7 which is provided for growth of a single-crystal alloy semiconductor material, in this embodiment epitaxial in relation to the at least one seed 7, as will be described in more detail hereinbelow, at least one semiconductor structure 11 which is formed of an alloy semiconductor material and extends from the at least one seed 7, and a capping layer 15, in this embodiment an insulating layer, which encapsulates the at least one semiconductor structure 11.

In this embodiment the substrate 3 comprises a substrate body 17, here a wafer, and an insulating layer 19 which is formed over the substrate body 17 and includes at least one aperture 21, with the substrate body 17 at the at least one aperture 21 providing the at least one seed 7.

In this embodiment the layers 15, 19 are formed of $SiO_2$, but in alternative embodiments could be formed of any suitable insulator, typically oxides or nitrides.

In one embodiment the semiconductor assembly comprises a single seed 7 from which a single semiconductor structure 11 is formed.

In another embodiment the semiconductor assembly comprises a plurality of seeds 7 from which a plurality of semiconductor structures 11 are formed.

In this embodiment the substrate body 17 is formed of a first material, here Si, which is a component of the alloy semiconductor material.

In this embodiment the substrate body 17 is a single-crystal wafer of Si.

Figure 3:
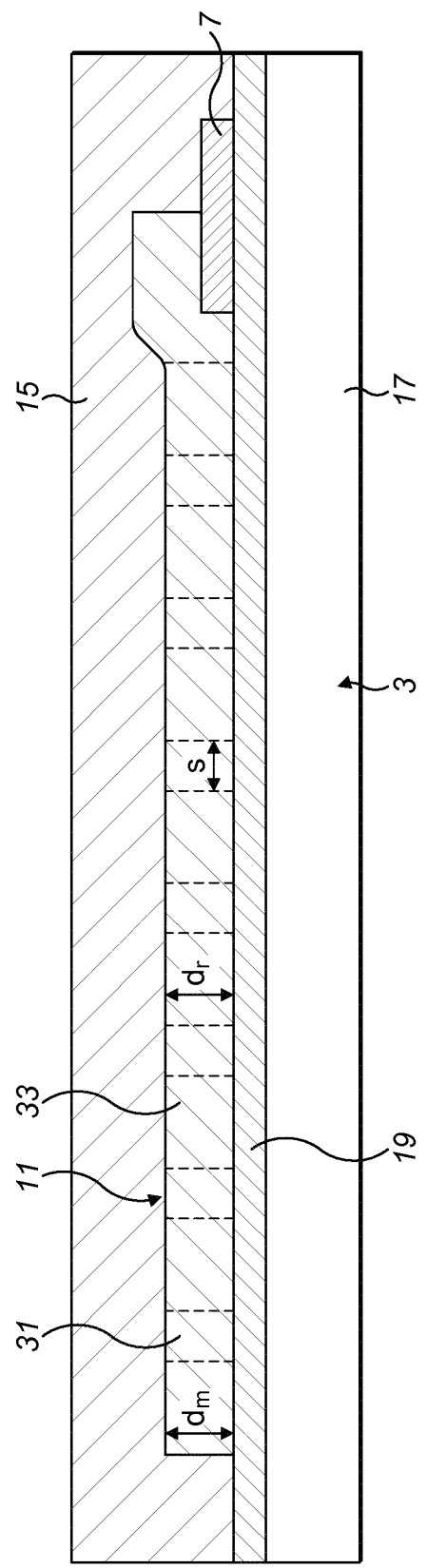
FIG. 3 illustrates a sectional view (along section I-I in FIG. 1) of a semiconductor assembly in accordance with a second embodiment of the present invention.

In an alternative embodiment, as illustrated in FIG. 3, the insulating layer 19 could omit the at least one aperture 21, and the at least one seed 7 provided on the substrate body 17, typically by patterning a layer which is formed on the substrate body 17.

In one embodiment the at least one seed 7 could be formed of poly-Si.

In another embodiment the at least one seed 7 could be formed of poly-SiGe or poly GeSi.

Figure 4:
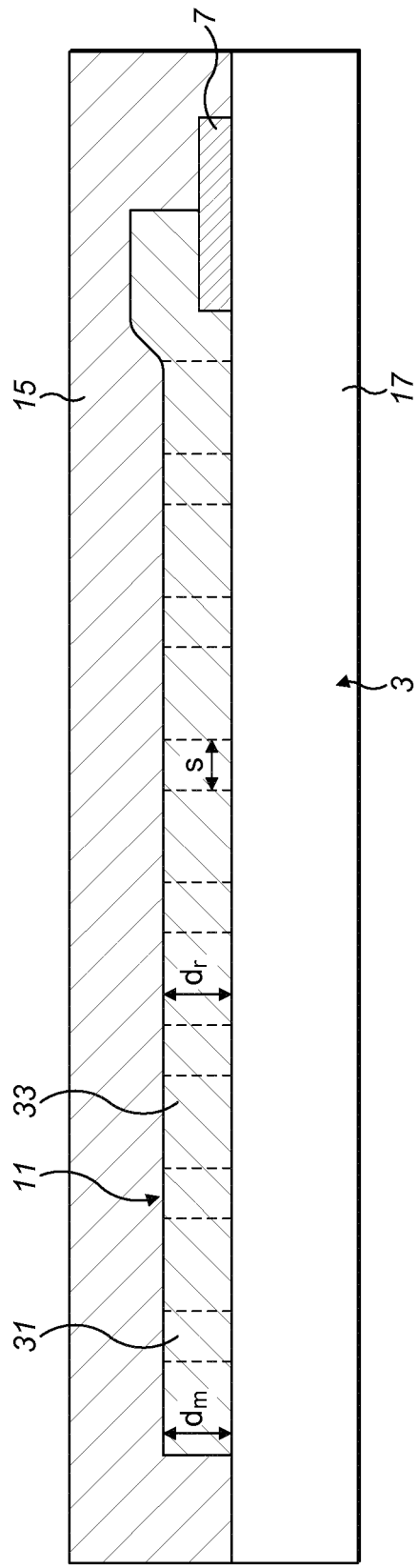
FIG. 4 illustrates a sectional view (along section I-I in FIG. 1) of a semiconductor assembly in accordance with a third embodiment of the present invention.

In another alternative embodiment, as illustrated in FIG. 4, the substrate body 17 could be formed of an insulating material and the insulting layer 19 omitted, and the at least one seed 7 provided on the substrate body 17, typically by patterning a layer which is formed on the substrate body 17.

In one embodiment the at least one seed 7 could be formed of poly-Si.

In another embodiment the at least one seed 7 could be formed of poly-SiGe or poly-GeSi.

In one embodiment the insulating material of the substrate body 17 could comprise $SiO_2$, but in alternative embodiments could be formed of any suitable insulator, typically oxides or nitrides.

In this embodiment the at least one semiconductor structure 11 comprises a main body 31 and a plurality of branch or radiating elements 33 which extend outwardly, and in spaced relation, from the main body 31. As will be described in more detail hereinbelow, the radiating elements 33 provide reservoirs or pools of the semiconductor material in a liquid state when the assembly is processed at an annealing temperature, thereby providing available supplies of the alloying material, in this embodiment Si, to the growth front in the main body 31.

In this embodiment the main body 31 comprises an elongate element, here a strip.

In this embodiment the main body 31 is a layer, here planar in form.

In this embodiment the main body 31 has a width $w_m$ of 5 µm. In preferred embodiments the main body 31 has a width $w_m$ of less than 10 µm, optionally not more than about 5 µm.

In this embodiment the main body 31 has a depth $d_m$ of 400 nm. In preferred embodiments the main body 31 has a depth $d_m$ of less than 10 µm, optionally not more than about 5 µm.

In this embodiment the main body 31 and the radiating elements 33 extend in a single plane, with the radiating elements 33 radiating outwardly in relation to the main body 31, here radiating laterally in substantially parallel relation to the main body 31.

In this embodiment the radiating elements 33 extend substantially in orthogonal relation to the main body 31.

In this embodiment the radiating elements 33 have a width $w_r$ of 5 µm. In preferred embodiments the radiating elements 33 have a width $w_r$ of less than 10 µm, optionally not more than about 5 µm.

In this embodiment the radiating elements 33 have a depth $d_r$ of 400 nm. In preferred embodiments the radiating elements 33 have a depth $d_r$ of less than 10 µm, optionally not more than about 5 µm.

In this embodiment the radiating elements 33 have a spacing s therebetween of 1 µm. In preferred embodiments the spacing s is not greater than about 5 µm, optionally not greater than about 3 µm, optionally not greater than about 2 µm, optionally not greater than 1.5 µm, and optionally not greater than about 1 µm.

In another embodiment the radiating elements 33 could extend out of a plane of the main body 31, such as vertically, upwardly and/or downwardly, in relation to the plane of the main body 31. In an alternative embodiment the radiating elements 33 could enclose an acute angle with the main body 31.

In yet another embodiment the radiating elements 33 could extend both in the plane of and out of the plane of the main body 31.

The melt-growth fabrication process for fabricating the above-described semiconductor assembly of FIGS. 1 and 2 is illustrated in FIGS. 5(a) to (e).

In a first step, as illustrated in FIG. 5(a), the insulating layer 19 is deposited on the substrate body 17.

In this embodiment the substrate body 17 is a <100> Si wafer and is cleaned using a conventional RCA clean prior to processing to remove any contaminants from the surface of the substrate body 17.

In this embodiment the insulating layer 19 is a 50 nm $SiO_2$ layer deposited using plasma-enhanced chemical vapour deposition (PE-CVD). In alternative embodiments the insulating layer could be deposited using hot-wire chemical vapour deposition (HW-CVD), low-pressure chemical vapour deposition (LP-CVD), sputtering, including RF and electron beam sputtering, or thermal oxidation.

In this embodiment the insulating layer 19 is densified, in order to prevent outgassing of the material of the insulating layer 19 into the semiconductor material of the at least one semiconductor structure 11, here the outgassing of $SiO_2$ into the Ge of the at least one semiconductor structure 11 during subsequent processing.

In a second step, as illustrated in FIG. 5(b), the insulating layer 19 is patterned, here using standard UV photolithography and a dilute (20:1) HF wet etch, in order to form the least one aperture 21 in the insulating layer 19 and expose the underlying substrate body 17, which in this embodiment provides the at least one seed 7 for crystallization of the semiconductor material of the at least one semiconductor structure 11, here exposing the underlying Si to act as a seed for the Ge of the at least one semiconductor structure 11 during subsequent processing.

Figure 5C:
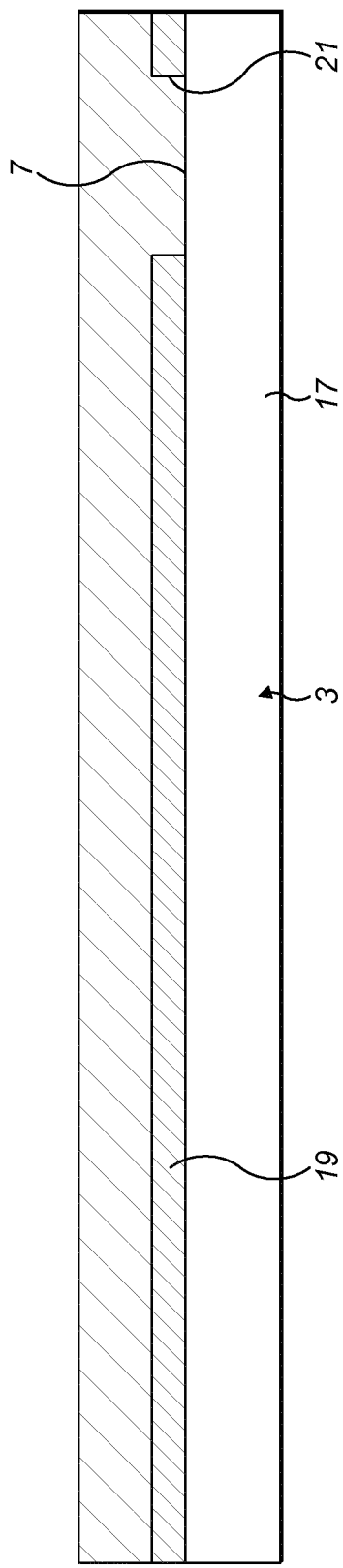

In a third step, as illustrated in FIG. 5(c), a layer of semiconductor material is deposited over the insulating layer 19 as patterned, here a 400 nm Ge layer deposited using a non-selective plasma-enhanced chemical vapour deposition (PE-CVD) process. In an alternative embodiment the layer of the host material could be deposited using hot-wire chemical vapour deposition (HW-CVD), reduced-pressure chemical vapour deposition (RP-CVD), or sputtering, including RF or e-beam sputtering. In this embodiment the semiconductor material is deposited in an amorphous state.

Figure 5D:
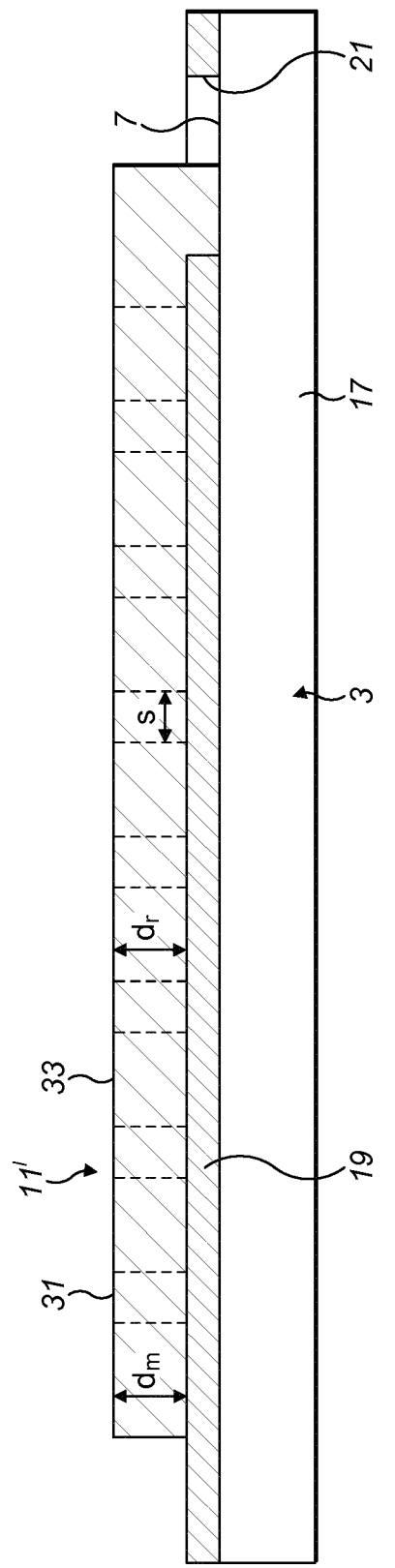

In a fourth step, as illustrated in FIG. 5(d), the layer of the semiconductor material is patterned to form at least one structural form 11' which corresponds to the at least one structure 11 and overlaps the at least one seed 7 as provided by the at least one aperture 21, here using standard UV photolithography and an inductively-coupled plasma (ICP) etch to leave the at least one Ge structure overlapping the at least one Si seed.

Figure 5E:
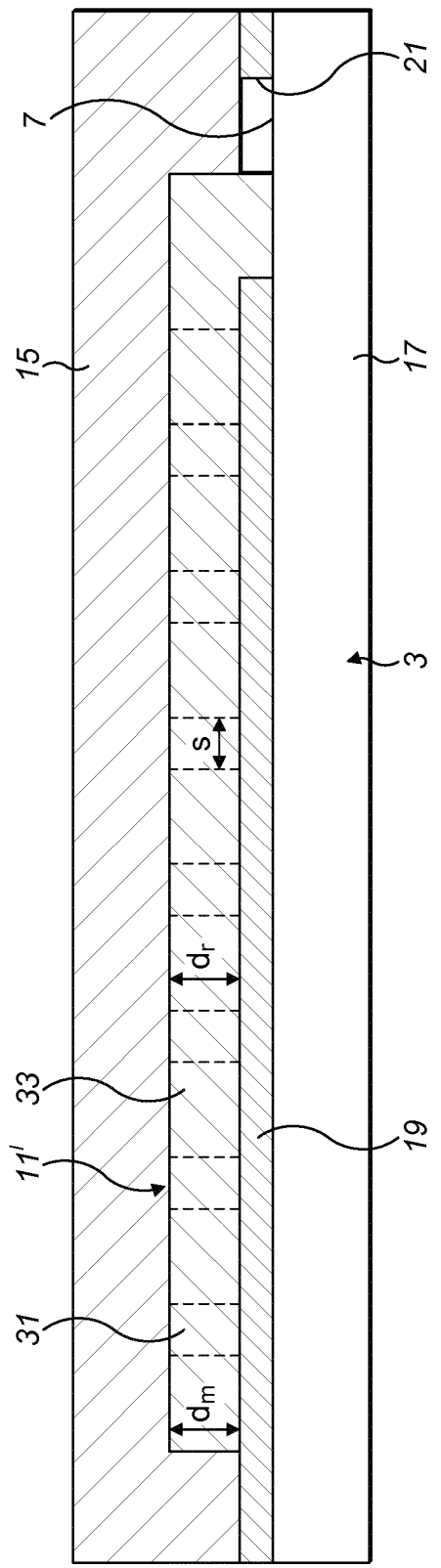

In a fifth step, as illustrated in FIG. 5(e), the capping insulating layer 15 is then deposited to encapsulate the at least one structural form 11', here a 1 µm $SiO_2$ layer deposited by PE-CVD. In an alternative embodiment the insulating layer 15 could be deposited using hot-wire chemical vapour deposition (HW-CVD), low-pressure chemical vapour deposition (LP-CVD), sputtering, including RF and electron beam sputtering, or thermal oxidation.

Subsequently, the resulting pre-form is heated in order to melt the material of the at least one structural form 11', and initiate crystallization of the semiconductor material from the at least one seed 7.

In this embodiment the heating is done using a rapid thermal annealer (RTA).

In another embodiment the heating could be done by laser.

In this embodiment the assembly is first stabilized at a temperature below the melting point of the semiconductor material of the at least one structural form 11', here to a temperature of 500° C., and subsequently ramped up to a maximum temperature (in this embodiment in the range of 955° C. to 1133° C.) at a rate of approximately 100° C./s. In preferred embodiments the temperature is increased at a rate of at least about 50° C./s, optionally at least 80° C./s.

In this embodiment the assembly is then maintained at the maximum temperature for a predetermined period of time, here for 1 second, in order to soak the assembly. In preferred embodiments the assembly is soaked for not longer than about 10 s, optionally not longer than about 5 s, optionally not longer than about 2 s, and optionally not longer than about 1 s.

In an alternative embodiment the assembly could not be subjected to any soaking time, and instead cooled immediately on reaching the maximum temperature.

Next, the assembly is cooled by ramping down the temperature to a temperature below the melting point of the semiconductor material, in this embodiment to room temperature, at a rate, at least initially, of approximately 100° C./s, in order to provide the finished, fabricated assembly. In preferred embodiments the temperature is decreased at a rate of at least about 50° C./s, optionally at least 80° C./s. In the present invention the rate of cooling ensures that the growth front propagates at a speed sufficient to avoid random nucleation within the at least one structural form 11' as such would result in multiple growth fronts and a polycrystalline material. For the purposes of characterization, the capping insulating layer 15 is removed, here removing the SiO$_2$ layer using a dilute (20:1) HF wet etch.

The melt-growth process of the present invention utilizes the fact that the host semiconductor material, in this embodiment Ge, has a lower melting point than the substituting or alloying material, in this embodiment Si, here temperatures of 938.2° C. and 1414° C. respectively, which means that the host material can be melted whilst the at least one seed 7 maintains its crystal structure.

Furthermore, the assembly is configured such that nucleation initially occurs at the at least one seed 7, thereby ensuring single-crystal, in this embodiment epitaxial, growth which initiates at the at least one seed 7 and propagates along the main body 31 of the at least one structural form 11'.

This controlled nucleation is in part caused by the at least one seed 7 and the associated substrate 3 acting as a heat sink, which provides that the semiconductor material is cooler at interface between the at least one seed 7 and the at least one structural form 11' than within the bulk of the at least one structural form 11' which is encapsulated by the insulating layers 15, 19, which are not only electrically insulating but also refractory in nature and provide thermal insulation.

And, this controlled nucleation is also in part caused by diffusion of the alloying material, in this embodiment Si, from the liquid into the host material, in this embodiment Ge, at the growth front, and diffusion of the host material, in this embodiment Ge, from the growth front into the liquid, which, as a consequence of the increased concentration of the alloying material at the solid-liquid interface, causes the material at the solid-liquid interface to have a higher solidification temperature as compared to the material within the bulk. FIG. 6 illustrates the phase diagram for the alloy GeSi (taken from Olesinski et al, "The Ge—Si (Germanium-Silicon) system", Bulletin of Alloy Phase Diagrams, Vol 5, pages 180-183, 1984), where it will be seen that the solidus temperature increases with increasing concentration of Si, thus promoting solidification at the region of highest concentration of Si and initially at the surface of the at least one seed 7.

In this embodiment, once the host material of the at least one structural form 11', here Ge, melts and becomes liquid, diffusion of the alloying material, here Si, into the host material dramatically increases, forming a liquid alloy, here a GeSi alloy. Since the diffusivity of the alloying material, here Si, in the host material, here Ge, is low in the solid state and high in the liquid state, being many orders of magnitude higher in liquid state, there is substantially no diffusion in the solid phase and it is expected that the alloy composition within the bulk of the liquid material of the at least one structural form 11' is substantially uniform.

When the alloy composition of the at least one structural form 11' is cooled, the crystallization is nucleated at the at least one seed 7, in this embodiment as provided by the exposed substrate body 17, and mimics the crystal structure of the underlying substrate body 17, in this embodiment <001> Si.

Once the semiconducting material has solidified at the seed interface, because of the very low diffusivity of the alloying material, here Si, in the solidified alloy, here the GeSi alloy, there is then only a finite amount of the alloying material in the semiconducting material which remains in the liquid phase. As will be seen from the phase diagram in FIG. 6, with continued cooling, there is a preferential solidification at the solid-liquid interface, insofar as the solid-liquid interface is rich in the alloying material and thus has a higher solidification temperature.

In a straight strip or wire, that is, if the at least one structural form 11' were to omit the radiating elements 33, the alloying material in the remaining liquid phase is depleted before the end of the wire or strip is reached, and is a function of the distance from the solid-liquid interface.

FIG. 7 illustrates a plot of the concentration of the host material, in this embodiment Ge, as a function of the distance from the seed 7 for (Sample #1) an assembly comprising only the main body 31 and no radiating elements 33, and the main body 31 having a width $w_m$ of 3 µm and a depth $d_m$ of 400 nm, annealed at a temperature of 955° C., and (Sample #2) an assembly of FIGS. 1 and 2 in which the main body 31 has a width $w_m$ of 3 µm and a depth $d_m$ of 400 nm and the radiating elements 33 have a width $w_r$ of 5 µm, a depth $d_m$ of 400 nm and a spacing s of 1 µm, annealed at a temperature of 955° C.

In this embodiment the concentration of the alloying material, here Si, in the semiconductor material of the at least one semiconductor structure 11, here Ge, is characterized using 532 nm Raman spectroscopy with a spot size of approximately 0.5 µm by taking a ratio of the SiGe mode integrated intensity to the GeGe mode integrated intensity, following Mooney et al[35].

As will be seen, the concentration of the alloying material decreases markedly as a function of distance along a length of the main body 31.

In the present invention, however, by virtue of providing the radiating elements 33 to the main body 31, the amount of the alloying material is substantially greater, which ensures that the depletion of the alloying material at the growth front is substantially reduced. Furthermore, by providing a plurality of radiating elements 33, and also arranging the radiating elements 33 in spaced relation along a propagation direction of the growth front, the present invention ensures that a reserve or pool of the liquid alloying material is maintained at the growth front, and though successive ones of the reserves or pools of the liquid alloying material become isolated from the growth front, further reserves or pools of the liquid alloying material remain available as the growth front advances.

FIG. 8 illustrates a plot of the concentration of the host material, in this embodiment Ge, as a function of the distance from the seed 7 for the main body 31 and the branch or radiating elements 33 (Branches #1-8, with Branch #1 being closest to the seed 7) of Sample #2.

As will be seen, the composition of the main body 31 is substantially uniform over a length thereof, whereas, in the branch or radiating elements 33, the concentration of the alloying material decreases markedly as a function of distance from the main body 31.

By way of explaining the mechanism of the present invention, in which the composition is quite uniform in the main body 31, but then decreases markedly in the branch or radiating elements 33, the cooling and solidification of the at least one semiconductor structure 11 was characterized using a poly-Si seed on a thick $SiO_2$ layer rather than a bulk Si wafer. This arrangement is such as to slow the cooling of the at least one semiconductor structure 11 by removing the heat sinking provided by the Si wafer substrate body 17. From scanning electron microscope (SEM) images, it is apparent that the main body 31 cools and solidifies prior to the branch or radiating elements 33 because random nucleation is observed in the branch or radiating elements 33 but not in the main body 31. It is thus hypothesized that the growth front propagates along the main body 31, and in so doing consumes the alloying material as provided by the branch or radiating elements 33 until solidification occurs thereat, and only then the growth propagates along the individual branch or radiating elements 33 with the solidified main body 31 at the inner ends of the respect branch or radiating elements 33 acting as a seed.

In the present invention the alloy composition can be controlled by the peak temperature employed in the growth process and the annealing time.

In this embodiment, not only is there increased thermal energy at higher temperatures, but, since the solidus curve provides for an increasing concentration of the alloying material, here Si, in the host material, here Ge, with increasing temperature, the alloy composition has an increasing concentration of the alloying material with increasing temperature.

FIG. 9 illustrates a plot of the concentration of the host material, in this embodiment Ge, as a function of the distance from the seed 7 for three assemblies of FIGS. 1 and 2 in which the main body 31 has a width $w_m$ of 3 μm and a depth $d_m$ of 400 nm and the radiating elements 33 have a width $w_r$ of 5 μm, a depth $d_m$ of 400 nm and a spacing s of 1 μm, annealed at temperatures of 955° C., 1027° C. and 1101° C., respectively. The temperatures were recorded using a pyrometer measuring the infra-red radiation from the back of the substrate 3 during annealing.

For all annealing temperatures, the semiconductor material shows a relatively-uniform composition over the entire main body 31 of the semiconductor structure 11, with the variance in concentration of the alloying material, here Si, being about 9% at 955° C., about 8% at 1027° C. and 3% at 1101° C.

This substantially-uniform composition over the entire main body 31 of the semiconductor structure 11 compares to the wire or strip having the same dimension as the main body 31 but without the radiating elements 33, which exhibits a very significant variation in the concentration of the host material, in this embodiment Ge, as a function of distance from the seed interface, as illustrated in FIG. 7.

By enabling control of the concentration of the alloying material in the semiconductor composition, the present invention enables the resulting at least one structure 11 to be tailored to the application, such as to enable tuning of the band edge and lattice parameters of the semiconductor.

Electon back-scatter diffraction (EBSD) measurements were also performed on structures 11 fabricated in accordance with the present invention.

FIG. 10 illustrates an electon back-scatter diffraction (EBSD) scan on a structure 11 fabricated in accordance with the present invention, which confirms that the main body 31 and the branch or radiating elements 33 of the semiconductor structure 11 have the same orientation as the substrate body 17, with no influence on growth direction. In this embodiment the <100> and <010> directions have the same crystal orientation as the Si wafer substrate body 17.

FIG. 11 illustrates transmission electron microscope (TEM) images of the interface between the at least one seed 7 at the surface of the substrate body 17 and the at least one semiconductor structure 11.

Threading dislocations, caused by the lattice constant mismatch between alloying material, here Si, and the host material, here Ge, are clearly observed in the transmission electron microscope (TEM), but are confined to the seed area and do not propagate along the main body 31 of the at least one semiconductor structure 11. The high-resolution cross-section confirms a single-crystal, defect-free structure, here an SGOI. Diffusion of the host material, here Ge, into the substrate body 17, here a Si wafer, can also be observed.

FIG. 12 illustrates a semiconductor assembly in accordance with a fourth embodiment of the present invention.

The semiconductor assembly of this embodiment has some similarity to the semiconductor assembly of the first-described embodiment, and thus in order to avoid unnecessary duplication of description, only the differences will be described in detail, with like parts being identified by like reference signs.

In this embodiment the semiconductor assembly differs from the first-described embodiment in comprising a plurality of semiconductor structures 11*a-d*, each being formed from a respective structural form 11'.

In this embodiment the structural forms 11' and the resulting semiconductor structures 11*a-d* extend commonly from one seed 7.

In this embodiment the main bodies 31 of the semiconductor structures 11*a-d* each have a portion which is shared with one or more of the other semiconductor structures 11*a-d*, and the main bodies 31 of each of the semiconductor structures 11*a-d* have a first section 31*a'-d'* which is proximal the one seed 7 and a second section 31*a"-d"* which is distal the one seed 7, with the second section 31*a"-d"* having the branch or radiating elements 33 connected thereto and being a portion of the respective main body 31 which is not shared with the main bodies 31 of the other semiconductor structures 11*a-d*, with a distance $d_{a-d}$ from the one seed 7 to a location proximal the second section 31*a"-d"* being different for each of the semiconductor structures 11*a-d*.

In this embodiment the first sections 31*a'-d'* of the main bodies 31 of the semiconductor structures 11*a-d* together define an interconnecting, manifold element 41, here an elongate or linear strip, and the second sections 31*a'-d'* of the main bodies 31 branch or radiate from the manifold element 41, here in orthogonal relation, but could have any angular relation.

In this embodiment the second sections 31*a'-d'* of the main bodies 31 branch or radiate from one side of the manifold element 41, but in an alternative embodiment one or more of the second sections 31*a'-d'* of the main bodies 31 could branch or radiate to opposite sides of the manifold element 41.

With this construction, by arranging the proximal ends of the second sections 31a"-d" of the main bodies 31 to be located at different distances $d_{a-d}$ from the one seed 7, the resulting semiconductor structures 11a-d can be formed with different, but uniform composition from the structural forms 11' of common composition and when subjected to the same thermal treatment. This configuration allows the composition of a plurality of semiconductor structures 11a-d to be determined by selectively setting the distances $d_{a-d}$ of the proximal ends of the second sections 31a"-d" of the main bodies 31 from the one seed 7.

FIG. 13 illustrates plots of the concentrations of the host material, in this embodiment Ge, as a function of the distance from the seed 7 for (Sample #3) the manifold element 41 and the second sections 31a"-d" of the main bodies 31 of the semiconductor structures 11a-d, with the manifold element 41 having a width of 5 µm, a depth of 400 nm and a length of 230 µm, the second sections 31a"-d" of the main bodies 31 having a width $w_m$ of 5 µm, a depth $d_m$ of 400 nm, a length of 65 µm and having proximal locations at 30 µm, 90 µm, 150 µm and 210 µm from the seed 7, and the radiating elements 33 have a width $w_r$ of 5 µm, a depth $d_m$ of 400 nm, a length of 20 µm and a spacing s of 3 µm, annealed at a temperature of 1017° C.

In this embodiment the concentration of the alloying material, here Si, in the semiconductor material of the manifold element 41 and the second sections 31a"-d" of the main bodies 31 of the semiconductor structures 11a-d, here Ge, is characterized using 532 nm Raman spectroscopy with a spot size of approximately 0.5 µm by taking a ratio of the SiGe mode integrated intensity to the GeGe mode integrated intensity, following Mooney et al[35].

As will be seen, the concentration of the alloying material decreases markedly as a function of distance along a length of the manifold element 41.

However, the concentration of the alloying material in the second sections 31a"-d" of the main bodies 31 of the semiconductor structures 11a-d is substantially uniform over the major extent thereof, here over a length of 56 µm, with the concentration being dependent upon the distance $d_{a-d}$ of the proximal location of each semiconductor structure 11a-d from the seed 7. In one embodiment the semiconductor structures 11a-d would, following fabrication, be etched to isolate the regions of the second sections 31a"-d" of the main bodies 31 which have substantially uniform composition.

As measured, the second sections 31a"-d" of the main bodies 31 of the semiconductor structures 11a-d have average concentrations from eight measured points respectively of 0.81, 0.92, 0.95 and 0.97 of the host material, with the standard deviations of the measured points in the second sections 31a"-d" of the main bodies 31 being respectively 0.006, 0.008, 0.004 and 0.002, which represents a variation in composition of less than 1% from the mean composition (and is within the measurement error).

As noted hereinabove, by virtue of providing the radiating elements 33 to the main bodies 31, the amount of the alloying material is substantially greater, which ensures that the depletion of the alloying material at the growth front is substantially reduced, and by arranging the radiating elements 33 in spaced relation along a propagation direction of the growth front, the present invention ensures that a reserve or pool of the liquid alloying material is maintained at the growth front, and though successive ones of the reserves or pools of the liquid alloying material become isolated from the growth front, further reserves or pools of the liquid alloying material remain available as the growth front advances.

FIG. 14 illustrates a semiconductor assembly in accordance with a fifth embodiment of the present invention.

The semiconductor assembly of this embodiment is quite similar to the semiconductor assembly of the fourth-described embodiment, and thus in order to avoid unnecessary duplication of description, only the differences will be described in detail, with like parts being identified by like reference signs.

In this embodiment the semiconductor assembly differs from the fourth-described embodiment in comprising a plurality seeds 7a-d, and in that the respective structural forms 11' and the resulting semiconductor structures 11a-d are separate, with the main bodies 31 thereof sharing no common portion, and each extend from respective ones of the seeds 7a-d.

In this embodiment the structural forms 11' and the resulting semiconductor structures 11a-d extend commonly from one seed 7.

In this embodiment, by arranging the proximal ends of the second sections 31a"-d" of the main bodies 31 to be located at different distances $d_{a-d}$ from the respective seeds 7, the resulting semiconductor structures 11a-d can be formed with different, but uniform composition from the structural forms 11' of common composition and when subjected to the same thermal treatment. This configuration allows the composition of a plurality of semiconductor structures 11a-d to be determined by selectively setting the distances $d_{a-d}$ of the proximal ends of the second sections 31a"-d" of the main bodies 31 from the respective seeds 7.

FIG. 15 illustrates a semiconductor assembly in accordance with a sixth embodiment of the present invention.

The semiconductor assembly of this embodiment is quite similar to the semiconductor assembly of the fourth-described embodiment, and thus in order to avoid unnecessary duplication of description, only the differences will be described in detail, with like parts being identified by like reference signs.

In this embodiment the semiconductor assembly differs from the fourth-described embodiment in that the respective structural forms 11' and the resulting semiconductor structures 11a-d are separate, with the main bodies 31 thereof sharing no common portion, each extending from the one seed 7.

In this embodiment, by arranging the proximal ends of the second sections 31a"-d" of the main bodies 31 to be located at different distances $d_{a-d}$ from the one seed 7, the resulting semiconductor structures 11a-d can be formed with different, but uniform composition from the structural forms 11' of common composition and when subjected to the same thermal treatment. This configuration allows the composition of a plurality of semiconductor structures 11a-d to be determined by selectively setting the distances $d_{a-d}$ of the proximal ends of the second sections 31a"-d" of the main bodies 31 from the one seed 7.

FIG. 16 illustrates a semiconductor assembly in accordance with a seventh embodiment of the present invention.

The semiconductor assembly of this embodiment is similar to the semiconductor assembly of the fourth-described embodiment, and thus in order to avoid unnecessary duplication of description, only the differences will be described in detail, with like parts being identified by like reference signs.

The semiconductor assembly of this embodiment differs from the fourth-described embodiment in that the respective structural forms 11' and the resulting semiconductor structures 11a-d are arranged in series, with the main bodies 31 thereof being provided by segments of a common, elongate element 51, here in the form of a strip, which extends from the one seed 7 at one proximal end.

In this embodiment, by arranging the proximal ends of the second sections 31a"-d" of the main bodies 31 to be located at different distances $d_{a-d}$ from the one seed 7, the resulting semiconductor structures 11a-d can be formed with different, but uniform composition from the structural forms 11' of common composition and when subjected to the same thermal treatment. This configuration allows the composition of a plurality of semiconductor structures 11a-d to be determined by selectively setting the distances $d_{a-d}$ of the proximal ends of the second sections 31a"-d" of the main bodies 31 from the one seed 7.

Finally, it will be understood that the present invention has been described in its preferred embodiments and can be modified in many different ways without departing from the scope of the invention as defined by the appended claims.

For example, in the described embodiment, the host material of the at least one structural form 11' is deposited as an elemental substance in amorphous form, here Ge, but could be deposited as an amorphous alloy, such as GeSi.

In other embodiments the main body 31 could take forms other than an elongate linear strip. For example, the main body element 31 could have any elongate form, or have other shape, such as rectangular, circular or annular form.

The present invention can also be applied to the fabrication of semiconductor structures 11 comprising substantially Ge or a GeSi alloy having a low concentration of Si, typically less than 1 at %, optionally less than 0.1 at %.

In one embodiment the at least one structure 11, fabricated in the manner as described hereinabove, can be subjected to a condensation process subsequent to melt growth, in which the alloying material of the at least one structure 11, in this embodiment Si, is preferentially oxidized, with the alloying material migrating to the surface of the at least one structure 11 and forming an oxide film, in this embodiment a $SiO_2$ film, with the remaining bulk being substantially formed of the host material, in this embodiment Ge, and having a concentration of less than 1 at % of the alloying material, optionally less than 0.1 at %. The oxidation is performed at a temperature below the melting point of the material of the at least one structure 11, in one embodiment less than 938° C. As a consequence of the limited diffusivity in the solid state, the oxidation process is performed over an extended period, typically several hours depending upon the partial pressure of $O_2$. Through use of this condensation step subsequent to melt growth, it is possible to achieve a substantially defect-free single-crystal structure of an elemental substance, in this embodiment Ge, which has high purity. This structure has particular application in photonics and electronics devices, and cannot be achieved using existing condensation methodologies, which yield structures with significant layer defects.

In one embodiment the semiconductor assembly is fabricated with the capping layer 15 for purposes of melt processing, and the capping layer 15 is removed, typically by wet etching or a combination of dry and wet etching, to allow for oxidation, which can be wet or dry oxidation, and a further capping layer, in this embodiment an insulating layer, is subsequently formed following oxidation, at least partially and over the at least one structure 11. In an alternative embodiment the capping layer 15 can remain during the condensation step.

In one modification of this alternative embodiment the at least one seed 7 could be formed of the host material, in this embodiment Ge, or substantially the host material, optionally in the form of a wafer, optionally a single crystal or polycrystalline.

In another modification of this alternative embodiment the at least one seed 7 could comprise an alloy of the host material and the alloying material, with the host material in major or substantial fraction, optionally having less than about 10 at % of the alloying material, in this embodiment Si, optionally less than about 5 at % of the alloying material, optionally in the form of a wafer, optionally as a single crystal or polycrystalline.

REFERENCES

1 Liu, J. et al. Waveguide-integrated, ultralow-energy GeSi electro-absorption modulators. *Nat Photon* 2, 433-437 (2008).
2 Feng, D. et al. High speed GeSi electro-absorption modulator at 1550 nm wavelength on SOI waveguide. *Opt Express* 20, 22224-22232, doi:10.1364/OE.20.022224 (2012).
3 Bakkers, E. P. A. M. et al. Epitaxial growth of InP nanowires on germanium. *Nat Mater* 3, 769-773, doi: http://www.nature.com/nmat/journal/v3/n11/suppinfo/nmat1235_S1.html (2004).
4 Liu, H. et al. Long-wavelength InAs/GaAs quantum-dot laser diode monolithically grown on Ge substrate. *Nat Photon* 5, 416-419 (2011).
5 Shu-Lu, C., Griffin, P. B. & Plummer, J. D. Single-Crystal GaAs and GaSb on Insulator on Bulk Si Substrates Based on Rapid Melt Growth. *Electron Device Letters, IEEE* 31, 597-599, doi:10.1109/LED.2010.2045875 (2010).
6 Pitera, A. J. et al. Coplanar Integration of Lattice-Mismatched Semiconductors with Silicon by Wafer Bonding Ge/Si1−x Ge x/Si Virtual Substrates. *Journal of The Electrochemical Society* 151, G443-G447, doi:10.1149/1.1757462 (2004).
7 Huang, C. H. et al. in *VLSI Technology*, 2003. *Digest of Technical Papers*. 2003 *Symposium on*. 119-120.
8 Taraschi, G., Pitera, A. J. & Fitzgerald, E. A. Strained Si, SiGe, and Ge on-insulator: review of wafer bonding fabrication techniques. *Solid-State Electronics* 48, 1297-1305, doi:http://dx.doi.org/10.1016/j.sse.2004.01.012 (2004).
9 Nakaharai, S., Tezuka, T., Sugiyama, N., Moriyama, Y. & Takagi, S.-i. Characterization of 7-nm-thick strained Ge-on-insulator layer fabricated by Ge-condensation technique. *Applied Physics Letters* 83, 3516-3518, doi:doi: http://dx.doi.org/10.1063/1.1622442 (2003).
10 Nelson, H. Epitaxial growth from the liquid state and its application to the fabrication of tunnel and laser diodes. *RCA Rev.* 24, 603 (1963).
11 Wieder, H. H., Clawson, A. R. & McWilliams, G. E. InxGa1−xAsyP1−y/InP heterojunction photodiodes. *Applied Physics Letters* 31, 468-470, doi:doi:http://dx-.doi.org./10.1063/1.89718 (1977).
12 Saul, R. H. & Roccasecca, D. D. Vapor-Doped Multislice LPE for Efficient GaP Green LED's. *Journal of The Electrochemical Society* 120, 1128-1131 (1973).
13 Panish, M. B., Hayashi, I. & Sumski, S. DOUBLE-HETEROSTRUCTURE INJECTION LASERS WITH ROOM-TEMPERATURE THRESHOLDS AS LOW AS 2300 A/cm2. *Applied Physics Letters* 16, 326-327, doi: doi:http://dx.doi.org/10.1063/1.1653213 (1970).

14 Tweet, D. J., Lee, J. J., Maa, J.-S. & Hsu, S. T. Characterization and reduction of twist in Ge on insulator produced by localized liquid phase epitaxy. *Applied Physics Letters* 87, 141908-141903 (2005).

15 Balakumar, S. et al. Fabrication Aspects of Germanium on Insulator from Sputtered Ge on Si-Substrates. *Electrochemical and Solid-State Letters* 9, G158-G160, doi: 10.1149/1.2179188 (2006).

16 Miyao, M., Tanaka, T., Toko, K. & Tanaka, M. Giant Ge-on-Insulator Formation by Si—Ge Mixing-Triggered Liquid-Phase Epitaxy. *Applied Physics Express* 2, 045503 (2009).

17 Miyao, M., Toko, K., Tanaka, T. & Sadoh, T. High-quality single-crystal Ge stripes on quartz substrate by rapid-melting-growth. *Applied Physics Letters* 95, 022115-022113 (2009).

18 Ohta, Y., Tanaka, T., Toko, K., Sadoh, T. & Miyao, M. Growth-direction-dependent characteristics of Ge-on-insulator by Si—Ge mixing triggered melting growth. *Solid-State Electronics* 60, 18-21, doi:10.1016/j.sse.2011.01.039 (2011).

19 Sakane, T., Toko, K., Tanaka, T., Sadoh, T. & Miyao, M. Strained single-crystal GOI (Ge on Insulator) arrays by rapid-melting growth from Si (1 1 1) micro-seeds. *Solid-State Electronics* 60, 22-25, doi:http://dx.doi.org/10.1016/j.sse.2011.01.037 (2011).

20 Bai, X., Chen, C.-Y., Griffin, P. B. & Plummer, J. D. Si incorporation from the seed into Ge stripes crystallized using rapid melt growth. *Applied Physics Letters* 104,-, doi:doi:http://dx.doi.org/10.1063/1.4863976 (2014).

21 Tojo, Y. et al. High-quality formation of multiply stacked SiGe-on-insulator structures by temperature-modulated successive rapid-melting-growth. *Applied Physics Letters* 102,-, doi:doi:http://dx.doi.org/10.1063/1.4794409 (2013).

22 Matsumura, R. et al. Growth-rate-dependent laterally graded SiGe profiles on insulator by cooling-rate controlled rapid-melting-growth. *Applied Physics Letters* 101,-, doi:doi:http://dx.doi.org/10.1063/1.4769998 (2012).

23 Koh, H. Y. S. *Rapid melt growth of silicon germanium for heterogeneous integration on silicon* PhD thesis, Stanford University, (2011).

24 Jia, F., Yaocheng, L., Griffin, P. B. & Plummer, J. D. Integration of Germanium-on-Insulator and Silicon MOSFETs on a Silicon Substrate. *Electron Device Letters, IEEE* 27, 911-913, doi:10.1109/led.2006.883286 (2006).

25 Jia, F. et al. High-Performance Gate-All-Around GeOI p-MOSFETs Fabricated by Rapid Melt Growth Using Plasma Nitridation and ALD Gate Dielectric and Self-Aligned NiGe Contacts. *Electron Device Letters, IEEE* 29, 805-807, doi:10.1109/led.2008.2000613 (2008).

26 Jia, F. et al. P-Channel Germanium FinFET Based on Rapid Melt Growth. *Electron Device Letters, IEEE* 28, 637-639, doi:10.1109/LED.2007.899329 (2007).

27 Tseng, C.-K. et al. A self-assembled microbonded germanium/silicon heterojunction photodiode for 25[emsp14]Gb/s high-speed optical interconnects. *Sci. Rep.* 3, doi:10.1038/srep03225 (2013).

28 Going, R. W., Loo, J., Tsu-Jae King, L. & Wu, M. C. Germanium Gate PhotoMOSFET Integrated to Silicon Photonics. *Selected Topics in Quantum Electronics, IEEE Journal of* 20, 1-7, doi:10.1109/JSTQE.2013.2294470 (2014).

29 Schaevitz, R. K., Roth, J. E., Shen, R., Fidaner, O. & Miller, D. A. B. in *Lasers and Electro-Optics, 2008 and 2008 Conference on Quantum Electronics and Laser Science. CLEO/QELS 2008. Conference on.* 1-2.

30 Lever, L. et al. Modulation of the absorption coefficient at 1.3 μm in Ge/SiGe multiple quantum well heterostructures on silicon. *Opt Lett* 36, 4158-4160 (2011).

31 Chaisakul, P. et al. 10-Gb/s Ge/SiGe Multiple Quantum-Well Waveguide Photodetector. *Photonics Technology Letters, IEEE* 23, 1430-1432, doi:10.1109/LPT.2011.2162724 (2011).

32 Luo, Y. et al. Strong Electro-Absorption in GeSi Epitaxy on Silicon-on-Insulator (SOI). *Micromachines* 3, 345-363 (2012).

33 Vivien, L. et al. 42 GHz p.i.n Germanium photodetector integrated in a silicon-on-insulator waveguide. *Opt. Express* 17, 6252-6257 (2009).

34 Jutzi, M., Berroth, M., Wohl, G., Oehme, M. & Kasper, E. Ge-on-Si vertical incidence photodiodes with 39-GHz bandwidth. *Photonics Technology Letters, IEEE* 17, 1510-1512, doi:10.1109/LPT.2005.848546 (2005).

35 Mooney, P. M., Dacol, F. H., Tsang, J. C. & Chu, J. O. Raman scattering analysis of relaxed Ge[sub x]Si[sub 1−x] alloy layers. *Applied Physics Letters* 62, 2069-2071 (1993).

The invention claimed is:

1. A method of fabricating at least one single-crystal alloy semiconductor structure, comprising:
forming at least one seed on a substrate for growth of at least one single-crystal alloy semiconductor structure, the at least one seed containing an alloying material;
providing at least one structural form on the substrate which is crystallized to form the at least one single-crystal alloy semiconductor structure, the at least one structural form being formed of a host material and comprising a main body which comprises an elongate element which extends from the at least one seed and a plurality of branch or radiating elements which extend outwardly from the main body and are connected in spaced relation to and along the main body;
heating the at least one structural form such that the host material of the at least one structural form has a liquid state; and
cooling the at least one structural form, such that the host material of the at least one structural form nucleates at the at least one seed and crystallizes as a single crystal to provide at least one single-crystal alloy semiconductor structure, with a growth front of the single crystal propagating in a direction along a length of the elongate element of the main body of the respective at least one structural form away from the respective at least one seed;
wherein the plurality of elements of the at least one structural form provide reservoirs of the alloying material in liquid state, such that successive ones of the plurality of elements as spaced along the main body act to maintain, in liquid state, an available supply of the alloying material to the growth front of the single crystal in the main body of the respective at least one structural form.

2. The method of claim 1, wherein the substrate comprises a substrate body and an insulating layer which is formed over the substrate body and includes at least one aperture, with the substrate body at the at least one aperture providing the at least one seed.

3. The method of claim 1, wherein the substrate comprises a substrate body and an insulating layer which is formed over the substrate body, and the at least one seed is formed on the insulating layer.

4. The method of claim 1, wherein the substrate comprises a substrate body which is formed of an insulating material, and the at least one seed is formed on the substrate body.

5. A semiconductor assembly incorporating the at least one single-crystal semiconductor structure fabricated using the method of claim 1.

6. A semiconductor pre-form from which at least one single-crystal semiconductor structure is fabricated, the semiconductor pre-form comprising:
   a substrate;
   at least one seed on the substrate for growth of at least one single-crystal alloy semiconductor structure, the at least one seed containing an alloying material;
   at least one structural form on the substrate which, when crystallized, forms the at least one single-crystal alloy semiconductor structure, the at least one structural form being formed of a host material and comprising a main body which comprises an elongate element which extends from the at least one seed and a plurality of branch or radiating elements which extend outwardly from the main body and are connected in spaced relation to the main body;
   wherein the plurality of elements of the at least one structural form provide reservoirs of the alloying material in liquid state when heated to a temperature above the melting point of the material of the at least one structural form, such that successive ones of the plurality of elements as spaced along the main body act to maintain during fabrication, in liquid state, an available supply of the alloying material to a growth front of a single crystal in the main body of the respective at least one structural form; and
   wherein when the at least one structural form is cooled such that the host material of the at least one structural form nucleates at the at least one seed and crystallizes as the single crystal to provide at least one single-crystal alloy semiconductor structure, the growth front propagates in a direction along a length of the elongate element of the main body of the respective at least one structural form away from the respective at least one seed.

7. The semiconductor pre-form of claim 6, wherein the substrate comprises a substrate body and an insulating layer which is formed over the substrate body and includes at least one aperture, with the substrate body at the at least one aperture providing the at least one seed.

8. The semiconductor pre-form of claim 6, wherein the substrate comprises a substrate body and an insulating layer which is formed over the substrate body, and the at least one seed is formed on the substrate body.

9. The semiconductor pre-form of claim 6, wherein the substrate comprises a substrate body which is formed of an insulating material, and the at least one seed is formed on the substrate body.

10. A semiconductor assembly incorporating at least one single-crystal semiconductor structure fabricated using the semi-conductor pre-form of claim 6.

11. A semiconductor assembly, comprising:
    a substrate; and
    at least one single-crystal semiconductor structure on the substrate, the at least one semiconductor structure being formed of an alloy of a host material and an alloying material and comprising a main body which comprises an elongate element which extends from at least one seed on the substrate and extends from and a plurality of branch or radiating elements which extend outwardly from the main body and are connected in spaced relation to and along the main body;
    wherein the at least one single-crystal semiconductor structure is fabricated by cooling at least one structural form such that the host material nucleates at the at least one seed and crystallizes as a single crystal to provide the at least one single-crystal alloy semiconductor structure, and wherein when the at least one structural form is cooled a growth front propagates in a direction along a length of the elongate element of the respective main body away from the respective at least one seed.

12. The semiconductor assembly of claim 11, wherein the substrate comprises a substrate body and an insulating layer which is formed over the substrate body and includes at least one aperture, with the at least one semiconductor structure extending from the at least one aperture.

13. The semiconductor assembly of claim 11, wherein the substrate comprises a substrate body and an insulating layer which is formed over the substrate body, and further comprising:
    at least one deposit which is formed on the substrate body from which extends the at least one semiconductor structure.

14. The semiconductor assembly of claim 11, wherein the substrate comprises a substrate body which is formed of an insulating material, and further comprising:
    at least one deposit which is formed on the substrate body from which extends the at least one semiconductor structure.

* * * * *